(12) United States Patent
Buono et al.

(10) Patent No.: US 10,697,295 B2
(45) Date of Patent: Jun. 30, 2020

(54) METHOD AND SYSTEM FOR ENHANCING HYDROCARBON OPERATIONS

(71) Applicants: Antonio S. Buono, Spring, TX (US); Shawn Fullmer, Katy, TX (US); Hubert E. King, Jr., Flemington, NJ (US); Michael Sansone, North Brunswick, NJ (US); Pavel Kortunov, Flemington, NJ (US); John H. Dunsmuir, Flemington, NJ (US); Bo Gao, Bellaire, TX (US); James G. Kralik, Houston, TX (US); Ye Xu, Bridgewater, NJ (US)

(72) Inventors: Antonio S. Buono, Spring, TX (US); Shawn Fullmer, Katy, TX (US); Hubert E. King, Jr., Flemington, NJ (US); Michael Sansone, North Brunswick, NJ (US); Pavel Kortunov, Flemington, NJ (US); John H. Dunsmuir, Flemington, NJ (US); Bo Gao, Bellaire, TX (US); James G. Kralik, Houston, TX (US); Ye Xu, Bridgewater, NJ (US)

(73) Assignee: ExxonMobil Upstream Research Company, Spring, TX (US)

(*) Notice: Subject to any disclaimer, the term of this patent is extended or adjusted under 35 U.S.C. 154(b) by 226 days.

(21) Appl. No.: 15/889,920

(22) Filed: Feb. 6, 2018

(65) Prior Publication Data

US 2018/0259467 A1    Sep. 13, 2018

Related U.S. Application Data

(60) Provisional application No. 62/469,876, filed on Mar. 10, 2017, provisional application No. 62/469,886, filed on Mar. 10, 2017.

(51) Int. Cl.
*G01R 33/62* (2006.01)
*E21B 49/02* (2006.01)
(Continued)

(52) U.S. Cl.
CPC .......... *E21B 49/02* (2013.01); *G01N 23/046* (2013.01); *G01N 24/081* (2013.01);
(Continued)

(58) Field of Classification Search
CPC ...... G01R 33/62; G01R 35/00; G01R 35/005; G01R 33/305; E21B 49/02; G01N 23/046;
(Continued)

(56) References Cited

U.S. PATENT DOCUMENTS 6,111,408 A * 8/2000 Blades ................. G01N 24/081
324/303
7,191,831 B2 * 3/2007 Reid ....................... E21B 49/04
166/264

(Continued)

OTHER PUBLICATIONS

Edelstein, et al. (1988) "NMR Imaging for Core Analysis", SPE Annual Technical Conference and Exhibition, Jan. 1, 1988, pp. 101-112, XP055472195, DOI: 10.2118/18272-MS.
(Continued)

*Primary Examiner* — Jermele M Hollington
*Assistant Examiner* — Taqi R Nasir
(74) *Attorney, Agent, or Firm* — ExxonMobil Upstream Research Company—Law Department

(57) ABSTRACT

A method and system are described for imaging core samples associated with a subsurface region. The imaging results may be used to create or update a subsurface model and using the subsurface model and/or imaging results in hydrocarbon operations. The imaging techniques may include NMR imaging and CT imaging. Further, the imaging
(Continued)

techniques may also include exposing the core sample to the imaging gas.

18 Claims, 11 Drawing Sheets

(51) Int. Cl.
*G01N 23/046* (2018.01)
*G01N 24/08* (2006.01)
*G01V 3/14* (2006.01)
*G01R 33/30* (2006.01)
*G01V 3/32* (2006.01)

(52) U.S. Cl.
CPC .............. *G01R 33/305* (2013.01); *G01V 3/14* (2013.01); *G01V 3/32* (2013.01); *G01N 2223/616* (2013.01)

(58) Field of Classification Search
CPC .. G01N 24/081; G01N 2223/616; G01V 3/14; G01V 3/32
USPC ....... 324/303, 300, 307, 308, 306, 312, 338, 324/322, 314, 318, 309, 339
See application file for complete search history.

(56) References Cited

U.S. PATENT DOCUMENTS

| | | |
|---|---|---|
| 9,507,047 B1 | 11/2016 | Dvorkin et al. |
| 2002/0017386 A1* | 2/2002 | Ringgenberg ........ E21B 21/002 166/250.17 |
| 2015/0362419 A1 | 12/2015 | Chertov et al. |
| 2017/0122858 A1* | 5/2017 | Li .......................... G01N 24/08 |
| 2018/0003786 A1* | 1/2018 | Washburn ............. G01R 33/44 |
| 2018/0080317 A1* | 3/2018 | Hopper .................. E21B 47/10 |

OTHER PUBLICATIONS

Wang, et al. (2015) "Quantitative Research on Tight Oil Microscopic State of Chang 7 Member of Triassic Yanchang Formation in Ordos Basin, NW China", Petroleum Exploration and Development, vol. 42, No. 6, Dec. 31, 2015, pp. 827-832, XP029361619; ISSN: 1876-3804, DOI: 10.1016/S1876-3804(15)30079-3.

Yoshito, et al. (2010) "Non-Destructive Analysis of Oil-Contaminated Oil Core Samples by X-ray Computed Tomography and Low-Field Nuclear Magnetic Resonance Relaxometry: A Case Study", Water, Air, and Soil Pollution, Kluwer Academic Publishers, DO, vol. 214, No. 1-4, May 22, 2010, pp. 681-698, XP019868854, ISSN: 1573-2932, DOI: 10.1007/S11270-010-0473-2.

* cited by examiner

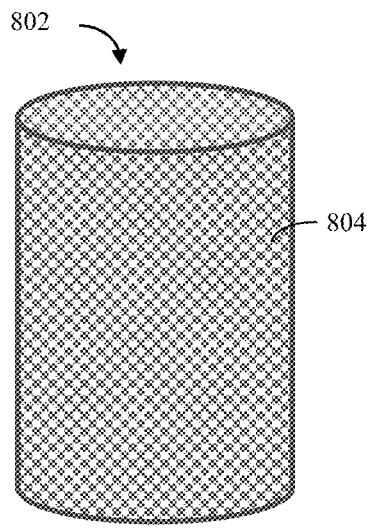
Figure 8A
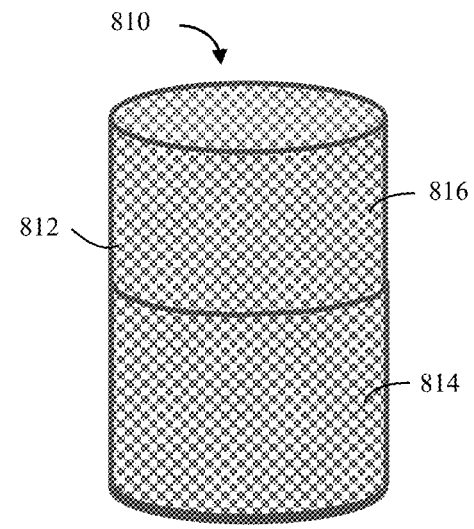
Figure 8B
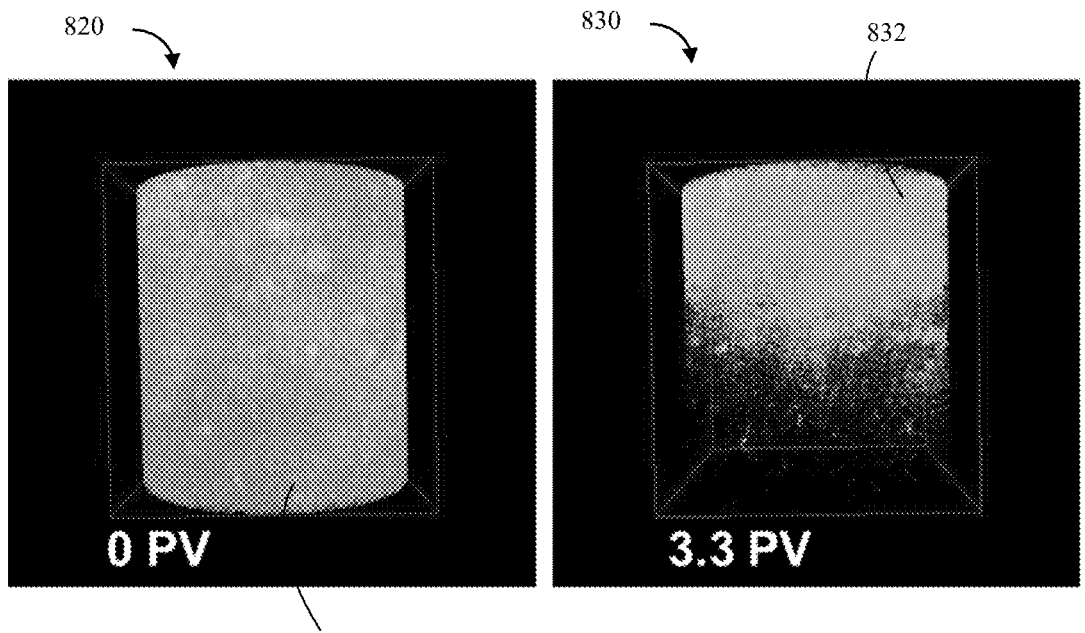
Figure 8C
Figure 8D

METHOD AND SYSTEM FOR ENHANCING HYDROCARBON OPERATIONS

CROSS-REFERENCE TO RELATED APPLICATIONS

This application claims the benefit of U.S. Provisional Application No. 62/469,876 entitled "Method and System for Enhancing Hydrocarbon Operations" filed on Mar. 10, 2017 and U.S. Provisional Application No. 62/469,886 entitled "Method and System for Enhancing Hydrocarbon Operations" filed on Mar. 10, 2017, the disclosures of which are incorporated herein by reference.

FIELD OF THE INVENTION

This disclosure relates generally to the field of hydrocarbon exploration, hydrocarbon development, and hydrocarbon production. Specifically, the disclosure relates to a method for evaluating core samples through imaging processes and using the imaging results to enhance subsurface models and hydrocarbon operations.

BACKGROUND

This section is intended to introduce various aspects of the art, which may be associated with exemplary embodiments of the present disclosure. This discussion is believed to assist in providing a framework to facilitate a better understanding of particular aspects of the present invention. Accordingly, it should be understood that this section should be read in this light, and not necessarily as admissions of prior art.

In hydrocarbon exploration, development, and/or production stages, different types of data are acquired and utilized to create subsurface models. The subsurface models may be used to represent the subsurface structures, which may include a description of a subsurface structures and material properties for a subsurface region. For example, the subsurface model may be a geologic model, a geomechanical model, or a reservoir model. The measured or interpreted data for the subsurface region may be utilized to create the subsurface model and/or to refine the subsurface model. For example, a geologic model may represent measured or interpreted data for the subsurface region, such as seismic data and well log data, and may have material properties, such as rock properties. As another example, a reservoir model may be used to simulate flow of fluids within the subsurface region. Accordingly, the subsurface models may include different scales to lessen the computations for modeling or simulating the subsurface within the model.

The development of the subsurface models may be problematic. For example, the measurement data may involve uncertainty regarding the specific properties and/or structures associated with a subsurface region. In particular, seismic data provides information at a coarser granularity than well logs and/or core samples. Accordingly, the seismic data may be utilized to provide coarse locations and/or properties, but any associated subsurface model may be based on assumptions (e.g., uncertainty).

To lessen the uncertainty in the subsurface model, well logs may be utilized to provide additional data for the subsurface region. Further, core samples or plugs may be obtained for analysis. In particular, the analysis may involve determining detailed flow data for the individual core plugs, which may involve obtaining measurements from the core plugs. Unfortunately, the analysis may be time-consuming and expensive. Also, the measured data can be difficult to relate to the underlying rock description, as provided by the geology, which focuses on the pore structure of the associated rock and its texture or fabric. While rocks with common geologic characteristics may be grouped by facies, it may be beneficial to relate facies to flow characteristics.

Accordingly, there remains a need in the industry for methods and systems that are more efficient and may lessen problems associated with subsurface modeling for hydrocarbon operations. Further, a need remains for an enhanced method to obtain, process, and evaluate data that relate how size, shape, and location of pores can be directly linked to flow characteristics, thus lessening uncertainty in subsurface models and techniques that may be efficiently used to recover hydrocarbons. Moreover, a need exists to enhance understanding of the presence, distribution, characteristics, and subsurface properties. The present techniques, which may link together geology description and flow characteristics, provide a method and apparatus that overcome one or more of the deficiencies discussed above.

SUMMARY

In one embodiment, a method for generating and using imaging results of a core sample for hydrocarbon operations is described. The method comprises: obtaining a core sample associated with a subsurface region; performing nuclear magnetic resonance (NMR) imaging on the core sample to create NMR imaging results of the core sample; performing computed tomography (CT) imaging on the core sample to create CT imaging results of the core sample; and outputting imaging results, wherein the imaging results comprise the NMR imaging results; the CT imaging results and any combination thereof.

In other embodiments, the method may include various enhancements. By way of example, the method may include determining producible fluid for the core sample based on the imaging results; determining distribution of oil, water or any combination thereof based on the imaging results; determining an amount of pores in the core sample, a distribution of pores in the core sample, content of the pores based on the imaging results; exposing a flood fluid to the core sample concurrently with the performing the CT imaging on the core sample or NMR imaging; drilling a well to obtain a core sample from the subsurface region; performing a flow simulation based on one of the imaging results; performing a hydrocarbon operation based on one of the imaging results, the simulation results and any combination thereof wherein the flood fluid is doped with a doping agent that has a selectivity for hydrocarbons over water greater than 5 and/or wherein the flood fluid is water or a hydrocarbon recovery fluid. Also, the method may include: performing a second CT imaging on the core sample; exposing a second flood fluid to the core sample concurrently with the performing the second CT imaging on the core sample; and comparing imaging results for the flood fluid and the second flood fluid to determine a more efficient hydrocarbon recovery fluid.

In another embodiment, an imaging system is described. The imaging system may include: a core sample unit; a nuclear magnetic resonance (NMR) imaging system; a computed tomography (CT) imaging system; memory and a monitor. The core sample unit comprises a housing and a plurality of valves, wherein the housing forms an interior region configured to hold a core sample and to isolate the interior region from external conditions, and wherein the plurality of valves are configured to provide fluid flow paths between the interior region and external locations to the interior region. The nuclear magnetic resonance (NMR) imaging system is configured to create NMR imaging results of the core sample within the core sample unit. The computed tomography (CT) imaging system is configured to create CT imaging results of the core sample within the core sample unit. The memory is configured to store the imaging results, wherein the imaging results comprise the NMR imaging results; the CT imaging results and any combination thereof. Also, the monitor configured to display the imaging results.

In other embodiments, the imaging system may include various enhancements. By way of example, the imaging system may include a control system configured to communicate with the NMR imaging system, the CT imaging system or any combination thereof and to manage acquiring the NMR imaging result, the CT imaging results or any combination thereof wherein the control system may be further configured to manage pressure conditions, temperature conditions or any combination thereof that the core sample is exposed to during the creation of the NMR imaging results or the creation of the CT imaging results; a heating unit coupled to the core sample unit, wherein the heating unit is further configured to communicate with the control unit and to adjust the temperature within the core sample unit and a temperature sensor coupled to the heating unit, the core sample unit or any combination thereof, wherein the temperature sensor is further configured to measure temperature data within the core sample unit and to communicate the temperature data with the control unit, the heating unit or any combination thereof a pressure unit coupled to the core sample unit, wherein the pressure unit is further configured to communicate with the control unit and to adjust the pressure within the core sample unit and a pressure sensor coupled to the pressure unit, the core sample unit or any combination thereof, wherein the pressure sensor is further configured to measure pressure data within the core sample unit and to communicate the pressure data with the control unit, the pressure unit or any combination thereof; a flood fluid unit in fluid communication with the core sample unit, wherein the flood fluid unit is configured to expose the core sample with a flood fluid; and/or wherein the flood fluid unit is configured to communicate with the control unit and to manage fluid flow of the flood fluid into the interior region of the core sample unit.

In yet another embodiment, a system for generating imaging results for a core sample associated with a subsurface region is described. The system comprises: a processor; an input device in communication with the processor and configured to receive input data associated with a subsurface region; memory in communication with the processor. The memory has a set of instructions, wherein the set of instructions, when executed by the processor, are configured to: isolate a core sample associated with a subsurface region within an imaging system; perform nuclear magnetic resonance (NMR) imaging on the core sample to create NMR imaging results of the core sample; perform computed tomography (CT) imaging on the core sample to create CT imaging results of the core sample; and output imaging results, wherein the imaging results comprise the NMR imaging results, the CT imaging results and any combination thereof.

In other embodiments, the system may include various enhancements. By way of example, the system may include wherein the set of instructions, when executed by the processor, that may be further configured to determine producible fluid for the core sample based on the imaging results; wherein the set of instructions, when executed by a processor, may be further configured to determine distribution of oil, water or any combination thereof based on the imaging results; wherein the set of instructions, when executed by a processor, may be further configured to determine an amount of pores in the core sample, a distribution of pores in the core sample, content of the pores based on the imaging results; wherein the set of instructions, when executed by a processor, may be further configured to expose a flood fluid to the core sample concurrently with the performing the CT imaging on the core sample or NMR imaging; wherein the set of instructions, when executed by a processor, may be further configured to perform a flow simulation based on one of the imaging results; and/or wherein the set of instructions, when executed by a processor, are further configured to perform a notification associated with a hydrocarbon operation based on one of the imaging results, the simulation results and any combination thereof. Also, the system may include wherein the set of instructions, when executed by a processor, are further configured to: perform a second CT imaging on the core sample; expose a second flood fluid to the core sample concurrently with the performing the second CT imaging on the core sample; and compare imaging results for the flood fluid and the second flood fluid to determine a more efficient hydrocarbon recovery fluid.

BRIEF DESCRIPTION OF THE DRAWINGS

The advantages of the present invention are better understood by referring to the following detailed description and the attached drawings.

FIGS. 8A to 8D are exemplary diagrams showing examples of CT imaging data analysis.

DETAILED DESCRIPTION

Figure 1:
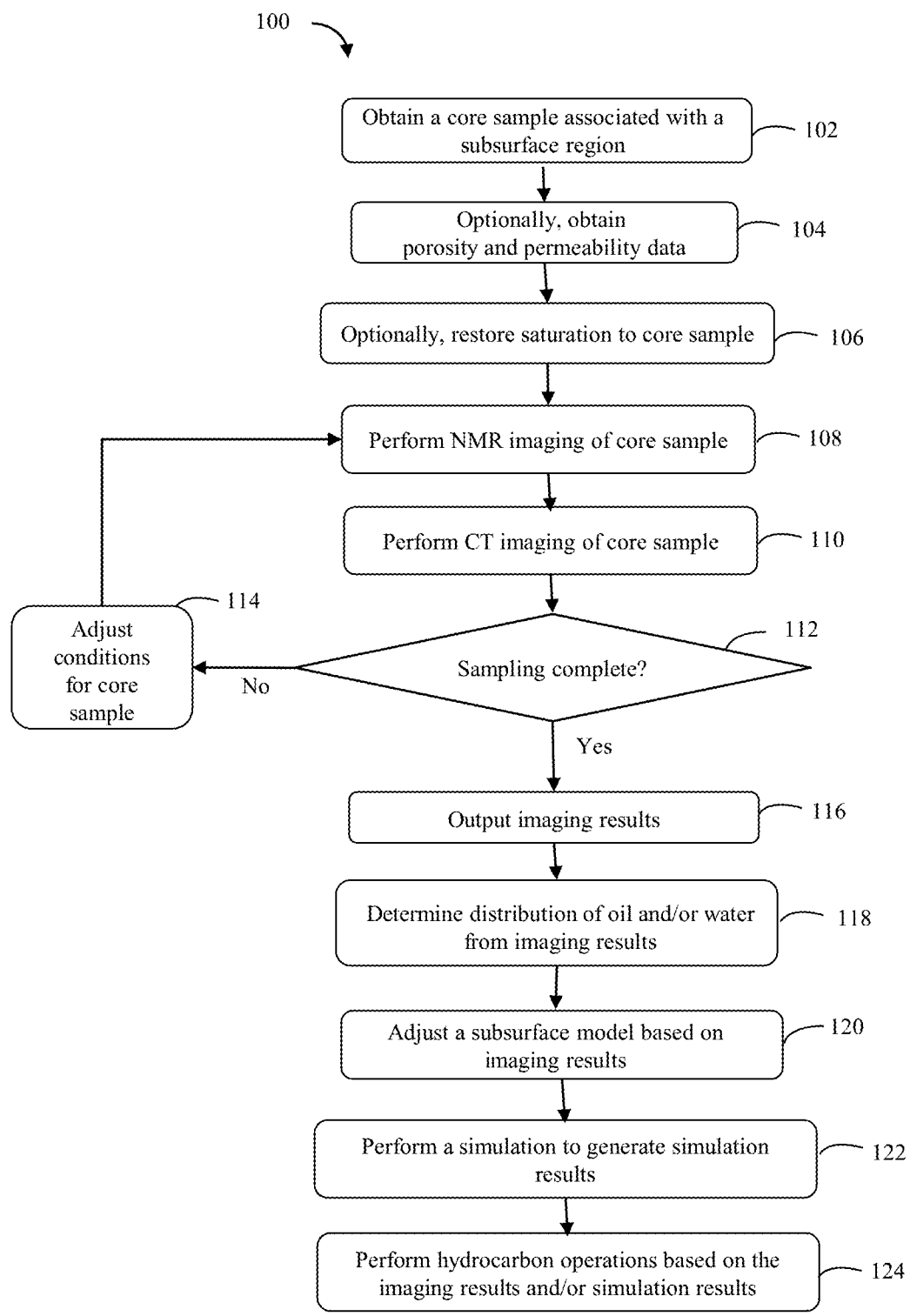
FIG. 1 is an exemplary flow chart involving imaging of core samples and using the imaging results in accordance with an embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a", and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide ($H_2S$) and carbon dioxide ($CO_2$). Preferred hydrocarbons may be produced from hydrocarbon reservoirs through wells penetrating a hydrocarbon containing formation. Hydrocarbons derived from a hydrocarbon reservoir may include, but are not limited to, oils, natural gas, petroleum, kerogen, bitumen, pyrobitumen, asphaltenes, tars, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models, and determining the likely locations for hydrocarbon reservoirs within the subsurface. The measurement data may include seismic data, gravity data, magnetic data, electromagnetic data, and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of the data to identify preferred development approaches and methods. By way of example, hydrocarbon development may include modeling of the subsurface formation, extraction planning for periods of production, determining and planning equipment to be utilized and techniques to be utilized in extracting the hydrocarbons from the subsurface formation, and the like.

As used herein, "hydrocarbon operation(s)" refers to any activity associated with hydrocarbon exploration, hydrocarbon development, and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure; mobilizing the hydrocarbon or treating by, for example, chemicals; hydraulic fracturing the wellbore to promote increased flow; well servicing; well logging; and other well and wellbore treatments.

As used herein, "subsurface model" refers to a reservoir model, geomechanical model, watertight model, and/or a geologic model. The subsurface model may include subsurface data distributed within the model in two-dimensions (e.g., distributed into a plurality of cells, such as elements or blocks), three-dimensions (e.g., distributed into a plurality of voxels), or three or more dimensions.

As used herein, "geologic model" is a model of the subsurface region having static properties. The geological model may include objects, such as faults and/or horizons, and properties, such as facies, lithology, porosity, permeability, and/or the proportion of sand and shale. The geological model may be a two-dimensional or three-dimensional model, but is preferably a three-dimensional model.

As used herein, "reservoir model" is a model of the subsurface region having dynamic properties that vary over the timescale of resource extraction. For example, the reservoir model may model fluid composition, pressure, and/or relative permeability over the timescale of hydrocarbon extraction. These dynamic properties may be modeled in addition to static properties, such as porosity and permeability. The reservoir model may be a two-dimensional or three-dimensional model, but is preferably a three-dimensional model.

As used herein, "mesh" or "grid" is a representation of a region of space (e.g., 2-D domain or 3-D domain), which may include objects, and includes two or more nodes and a set of polygons or polyhedra disposed within the region (e.g., a volumetric representation). The mesh may represent each object by a set of polygons or polyhedra disposed within the region. Properties may be assigned to some or all polygons. A mesh may include nodes, edges, faces, and in some cases, cells or mesh elements.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, and/or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, and/or energy release of the rock as a function of time and space in response to boundary conditions, such as displacements or tractions, heat or fluid pressures applied to a geomechanical model with specified initial conditions.

As used herein, "subsurface" means beneath the top surface of any mass of land at any elevation or over a range of elevations, whether above, below or at sea level, and/or beneath the floor surface of any mass of water, whether above, below or at sea level.

As used herein, "NMR imaging" relates to a method that produces imaging results of a core sample based upon NMR techniques. The NMR imaging is a method that involves the magnetic spins associated with certain atoms (e.g., protons in hydrocarbon fluids) producing information that is specific to fluids, detecting gases, liquid, heavy hydrocarbons and other fluids, such as brine, and gases, such as $CO_2$. The application of NMR techniques are known by those skilled in the art. The present techniques may use a low-field magnet equipped with gradient coils, a medium-field magnet equipped with gradient coils, a high-field magnet equipped with gradient coils, or any combination thereof. The NMR techniques may provide four different types of measurements. The measurements may include: (i) oil and/or water content of a core sample using proton spectroscopy (where such measurement may provide an indication of total porosity); (ii) oil and/or water content for each pore size using $T_2$ or $T_1$ relaxometry; (iii) one-dimensional (1-D), two-dimensional (2-D), and/or three-dimensional (3-D) magnetic resonance imaging (MRI) of oil and/or water concentration along the core sample length in a sample slice or in a sample voxel, and (iv) dynamics of fluids, such as brine and hydrocarbons at equilibrium (self-diffusion) or under induced flow with pulsed field gradient (PFG) NMR diffusometry, the latter measurements define fractions of movable and immobile fluids. Additionally, high-field NMR spectrometers (e.g., high-field magnet equipped with gradient coils) provide detection and imaging of carbon and nitrogen containing species.

As used herein "CT imaging" relates to a method that produces imaging results of a sample using CT imaging techniques. The CT imaging is based upon the variation in X-ray attenuation for the components. Although CT imaging may be used as a characterization tool, small pores may produce ambiguous results. In addition, differentiating between oil and water-filled pores may not be feasible. The present techniques utilizes the in-situ labeling of pore space by use of a highly X-ray attenuating fluid, such as an imaging fluid (e.g., imaging gas). By selecting an imaging fluid preferentially soluble in oil, such as xenon gas and/or krypton gas, CT images may reveal oil-filled pores and/or water-filled pores. By comparing x-ray tomography images produced with and without an imaging gas, such as xenon gas and/or krypton gas, the pore structure may be fully characterized, which may involve determining the number, the size, and the location of oil-filled pores, gas-filled pores, and/or water-filled pores throughout the core sample. Based on this characterization, the fluid flow may be imaged and related to the fluid type and pore structure. The characterizations and/or fluid flow may be used to lessen uncertainty in subsurface models associated with the subsurface region.

In hydrocarbon operations, measurement data may be obtained and evaluated to create or update understanding of subsurface regions and/or to enhance recovery of hydrocarbons. For example, measurement data may be used in the creation of a subsurface model or to update an existing subsurface model. The subsurface model is a computerized representation of a subsurface region based on geophysical and geological observations made on and below the surface of the Earth. The subsurface model may be a numerical equivalent of a three-dimensional geological map complemented by a description of physical quantities in the region being modeled, which may include core samples and other measured data. The subsurface model may include a mesh or grid of nodes to divide the region of the subsurface model into mesh element or cells, which may include blocks in two-dimensions, voxels in three-dimensions, or other suitable mesh elements in other dimensions. A cell, such as block, mesh element, or voxel, is a subvolume of the space, which may be constructed from nodes within the mesh. In the subsurface model, material properties, such as rock properties (e.g., permeability and/or porosity), may be represented as continuous volumes or unfaulted volumes in the design space, while the physical space may be represented as discontinuous volumes or faulted volumes (e.g., contain volume discontinuities, such as post-depositional faults).

However, the creation of a subsurface model is difficult because of the uncertainty associated with the distribution of properties throughout the entire subsurface model space. For example, seismic data may be utilized with well log data to provide some initial range of values associated with the subsurface region. Yet, more information may be needed to effectively populate the subsurface model properties, which may provide a linkage between precise laboratory property determinations (e.g., total porosity measured by helium porosimetry) and the geology. Accordingly, the present techniques may provide a linkage between geology, pore structure, and flow characteristics, which may also lessen uncertainty in the subsurface modeling process.

The present techniques may be utilized to lessen uncertainty in subsurface modeling and hydrocarbon operations. The present techniques involve a method of evaluating a core sample by performing NMR imaging, performing CT imaging, exposing an imaging fluid to the core sample, and/or exposing a flood fluid to the core sample. The present techniques may be used or integrated to further enhance the core sample processing and provide a mechanism to determine and quantify the amount of pores in the core sample, distribution of pores in the core sample, and/or the contents of the pores in the core sample based on the imaging results, which may lessen uncertainty in the subsurface model. By way of example, such determinations may reveal the properties that relate to the flow of hydrocarbons and economic potential of the reservoir rocks, which may also be utilized to enhance recovery of hydrocarbons.

In certain configurations, the present techniques may utilize various imaging techniques to enhance imaging results used for subsurface models and/or hydrocarbon operations. For example, the present techniques may involve performing two or more imaging techniques to acquire or obtain imaging results for a core sample. The imaging techniques may include (i) nuclear magnetic resonance (NMR) imaging; (ii) X-ray tomography imaging (e.g., CT imaging); or (iii) any combination thereof, for example.

In other embodiments, the present techniques may utilize one or more imaging techniques, separately and/or in combination, with an imaging fluid and/or a flood fluid. The imaging fluid may include Xenon (Xe) gas and/or Krypton (Kr) gas. By way of example, the imaging fluid may comprise greater than or equal to 20 volume percent of xenon gas based on the total volume of the imaging fluid; greater than or equal to 50 volume percent of xenon gas based on the total volume of the imaging fluid; greater than or equal to 70 volume percent of xenon gas based on the total volume of the imaging fluid; greater than or equal to 80 volume percent of xenon gas based on the total volume of the imaging fluid; or greater than or equal to 90 volume percent of xenon gas based on the total volume of the imaging fluid. In other examples, the imaging fluid comprises greater than or equal to 20 volume percent of krypton gas based on the total volume of the imaging fluid; greater than or equal to 50 volume percent of krypton gas based on the total volume of the imaging fluid; greater than or equal to 70 volume percent of krypton gas based on the total volume of the imaging fluid; greater than or equal to 80 volume percent of krypton gas based on the total volume of the imaging fluid; or greater than or equal to 90 volume percent of krypton gas based on the total volume of the imaging fluid.

In yet another example, the present techniques may utilize one or more imaging techniques, separately and/or in combination, with a flood fluid. The flood fluid may include water ($H_2O$), deuterium oxide ($D_2O$), drilling fluid, carbon dioxide ($CO_2$), nitrogen ($N_2$), ammonia, methane, ethane, a brine water solution, or any other fluid of interest. By way of example, the flood fluid may be water or may be a hydrocarbon recovery fluid, which is used with recovery operations to sweep subsurface regions. The flood fluid may be doped with a doping agent that has a selectivity for hydrocarbons over flood-fluid greater than 1.1; greater than 2; greater than 4, or greater than 5. In certain configurations, multiple CT imaging process may be performed on a core sample to determine the flood fluid that provides the preferred recovery for a subsurface region. For example, the process may include a second CT imaging that may be performed on the core sample in addition to a first CT imaging; exposing a second flood fluid to the core sample concurrently with the performing the second CT imaging on the core sample; and comparing imaging results for the flood fluid and the second flood fluid to determine a more efficient hydrocarbon recovery fluid.

Nuclear magnetic resonance (NMR) imaging may be one of the imaging technologies utilized in the present techniques. NMR imaging may involve the use of a hydrogen component (e.g., water ($H_2O$), hydrocarbons ($C_xH_x$) of the fluids that fill the pores of a sample). Although industry standard low-field NMR techniques may provide porosity and pore size determination, a direct quantification of water and/or oil content can be problematic. Accordingly, the present techniques may involve the use of a high-field NMR spectrometer equipped with gradient coils, which is configured to obtain four types of measurements: (i) oil and/or water content of a sample using proton spectroscopy (e.g., a total porosity); (ii) oil and/or water content for each pore size using $T_2$ or $T_1$ relaxometry; (iii) 1-D MRI, 2-D MRI and 3-D MRI of oil and/or water concentration along sample length in sample slice or in sample voxel; and (iv) dynamics of brine and hydrocarbons at equilibrium (self-diffusion) or under induced flow with PFG NMR diffusometry. The latter measurements define fractions of movable and immobile fluids. Additionally, high-field NMR spectrometers enable detection and imaging of carbon and nitrogen containing species.

In certain configurations, the NMR imaging results may be obtained with pressure being applied to the sample. For example, the NMR imaging data may be acquired or collected while applying a pressure gradient to induce flow. This applied pressure may be used to provide information associated with evaluation of in-situ fluid movement, which may include the difference between oil and/or water mobility. Following such flow, a quantitative measure of oil and/or water content may provide a mechanism to evaluate the potential for oil recovery from the sample, which may be a reservoir rock associated with a subsurface region.

X-Ray tomography imaging may be another of the imaging technologies utilized in the present techniques. X-ray tomography imaging, which may be referred to as computed tomography (CT) imaging, may be used as a characterization tool to measure both the 2-D and 3-D structure of materials, including porous media. Measuring porosity, pore size, and/or pore location may be performed in a variety of approaches. However, such measurements may be problematic when the pores are smaller than the resolution of the imaging technique.

Because differentiating between oil-filled pores and water-filled pores may be difficult with imaging technologies, the present techniques may utilize an imaging gas stream to enhance the analysis of the core sample. For example, the present techniques may use in-situ labeling of connected pore space by use of an imaging gas stream (e.g., xenon gas and/or krypton gas) and its associated x-ray absorption properties. As the imaging fluid may be preferably provided in a gaseous state, the operating conditions may be determined by the specific imaging fluid and the desired pressure and temperature conditions (e.g., which may fully fill the pore space). The operating conditions may be adjusted based on the different composition of the imaging fluid.

The selection of the imaging fluid, such as the imaging gas, may further enhance the imaging techniques. For example, the imaging fluid may be selected to interact with the oil and/or other specific formation fluids (e.g., water) to differentiate between the different fluids. As a specific example, the imaging fluid may be an imaging gas which interacts with oil, but is less likely to interact with water (e.g., the partition coefficient may be such that the imaging gas preferentially interacts with oil or hydrocarbons as compared with water). For example, the imaging gas may be a Xenon gas or a Krypton gas. Because the imaging fluid may preferentially pass into the hydrocarbons (e.g., oil phase) and not the other fluids, such as water, the imaging fluid may be used to assist in the labeling of the pores. As a first labeling technique, the imaging fluid may selectively highlight oil-filled pores. In addition, a secondary labeling technique may occur for empty pores, which may be filled with the imaging fluid. Because the water-filled pores do not include appreciable imaging fluid (e.g., xenon gas and/or krypton gas), a third labeling techniques may involve identifying these water-filled pores, as well. Therefore, by comparing imaging results (e.g., x-ray tomography images) produced with and without the imaging gas infusion, the characterization of the pore structure, determining the number, size and location of oil-fill, gas-filled, and water-filled pores throughout the sample.

As may be appreciated, the partition coefficient is a ratio of concentrations of a compound in a mixture of two immiscible phases at equilibrium. For the above example, the partition coefficient of the imaging gas may be selective to oil as compared to water. The partition coefficient may be about 10:1, or in the range of from 8:1 to 12:1. However, in other configurations, the partitioning coefficient may be about 20:1, or in the range of from 18:1 to 22:1.

In performing the imaging techniques on the core sample, the operating conditions may include various configurations. In one configuration, the operating conditions may be similar to downhole conditions, which may involve similar temperatures and/or pressures along with similar flow conditions (e.g., laminar flow). For example, the downhole conditions may involve pressures in the range between 10 pounds per square inch (psi) and 4000 psi, in the range between 10 psi and 2000 psi, or in the range between 10 psi and 1000 psi. Also, the downhole conditions may involve temperatures in the range between 60° Fahrenheit (F) and 800° F., in the range between 60° F. and 600° F., or in the range between 60° F. and 500° F.

In another configuration, the operating conditions may involve laboratory conditions, which may involve temperatures, pressures, and/or flow regimes that are different from downhole conditions, but may be determined to be appropriate to determine the associated properties and/or pore distribution. For example, laboratory conditions may include pressures in the range between 10 psi and 500 psi, in the range between 10 psi and 250 psi, or in the range between 10 psi and 100 psi. Also, the laboratory conditions may involve temperatures in the range between 40° F. and 600° F., in the range between 40° F. and 500° F., or in the range between 60° F. and 400° F. As a specific example, flood fluid may be provided in a range between 10 psi and 250 psi, while the imaging fluid may be provided in a range between 10 psi and 150 psi.

Beneficially, the present techniques provides various enhancements. First, pores that are smaller than the imaging resolution, which may be defined by one cell or voxel, may be correctly analyzed with respect to the net effect on the voxel volume. This aspect may be referred to as sub-voxel resolution. Second, conventional tomography imaging techniques utilize specialized non-native liquids to provide contrast between oil and water. Yet, in the present techniques, the non-native fluids do not have to be introduced or used with the core sample. By not using non-native fluids, any changes in wetting characteristics of the core sample that occur may be lessened when non-native fluids are introduced (e.g., liquids). Accordingly, the use of the imaging fluid (e.g., an imaging gas, such as xenon gas or krypton gas) does not alter the core sample (e.g., rock) and may be utilized on the native fluids in the core sample.

In addition, the present techniques may include various configurations that utilize pressure as well in performing the imaging techniques. These imaging techniques may be performed with the core sample enclosed in a flow cell under confining pressure. The flow cell may provide a mechanism for the evaluation of flow-induced oil and/or water changes throughout the core sample. The pore by pore evaluation of flow provides additional measurement data, which may provide data associated with the potential of reservoir rocks where flow may be controlled by complex pore geometry.

In certain configurations, a flood fluid may be utilized to enhance the evaluation. For example, in secondary recovery, water, another fluid, or gas may be utilized to push oil from the rock in the subsurface formation. This flow depends on pore structure and, therefore, how to maximize recovery and to identify by-passed regions that may be obtained through this procedure.

In other configurations, the NMR imaging may be used to guide or may be integrated with another imaging technique. For example, the NMR imaging may be used with CT imaging. The NMR imaging, which is sensitive to the fluid components of the core sample (e.g., rock), provides additional data or constraints that may be used in analyzing the CT imaging, which detects both fluid and rock. For example, the NMR imaging results may provide: 1) total fluid-filled porosity; 2) small pore to large pore ratio; and/or 3) water and/or oil content of the core sample.

In certain configurations, apportioning the image data into constituents (e.g. rock, water, oil, etc.) may be one of the analysis steps. The apportioning of the image data may be referred to as segmentation. Conventional imaging may introduce error, which the present techniques may be able to lessen the uncertainty. For example with CT imaging results, the segmentation procedure may divide the tomography voxel data into features. While various methods may be used, each may involve selecting an approximate X-ray attenuation coefficient corresponding to each feature. Conventional selection of the X-ray attenuation coefficients, which uses image data alone, is challenging and has significant uncertainty in the feature definition. Accordingly, the present techniques may perform segmentation, which may rely upon another imaging technique to constrain the linear attenuation coefficients. By way of example, CT imaging results may utilize NMR imaging results to constrain the selection of X-ray attenuation coefficients. This may involve applying a first constraint to obtain the sets of coefficients that provide the porosity that is properly constrained. Using a second constraint, a coefficient pair may be selected, which may duplicate the pore size structure. Finally, a third constraint may manage the selection of a coefficient for the imaging fluid (e.g., imaging gas, such as xenon gas or krypton gas) saturated oil yielding accurate oil/water content. The combination of the constraints provides a quantitative segmentation, which is not obtainable using conventional analysis, and lessens uncertainties in defining quantities and locations of oil and/or water throughout the core sample. This aspect may provide additional information to define the residual oil following the flood fluid.

To provide various enhancements, the present techniques may involve performing a method for generating and using imaging results of a core sample for hydrocarbon operations. The method may comprise: obtaining a core sample associated with a subsurface region; performing nuclear magnetic resonance (NMR) imaging on the core sample to create NMR imaging results of the core sample; performing computed tomography (CT) imaging on the core sample to create CT imaging results of the core sample; and outputting imaging results, wherein the imaging results comprise the NMR imaging results, the CT imaging results, and any combination thereof.

In other configurations, the method may include various enhancements. By way of example, the method may include determining producible fluid for the core sample based on the imaging results; determining distribution of oil, water or any combination thereof based on the imaging results; determining an amount of pores in the core sample; determining a distribution of pores in the core sample; determining the content of the pores based on the imaging results; exposing a flood fluid to the core sample concurrently with the performing the CT imaging on the core sample or NMR imaging; drilling a well to obtain a core sample from the subsurface region; performing a flow simulation based on one of the imaging results; performing a hydrocarbon operation based on one of the imaging results, the simulation results and any combination thereof; exposing a flood fluid to the core sample, wherein the flood fluid is doped with a doping agent that has a selectivity for hydrocarbons over water greater than 5 and/or wherein the flood fluid is water or a hydrocarbon recovery fluid. Also, the method may include: performing a second CT imaging on the core sample; exposing a second flood fluid to the core sample concurrently with the performing the second CT imaging on the core sample; and comparing imaging results for the flood fluid and the second flood fluid to determine a more efficient hydrocarbon recovery fluid.

In another configuration, the present techniques may involve an imaging system. The imaging system may include: a core sample unit; a nuclear magnetic resonance (NMR) imaging system; a computed tomography (CT) imaging system; memory; and a monitor. The core sample unit comprises a housing and a plurality of valves, wherein the housing forms an interior region configured to hold a core sample and to isolate the interior region from external conditions, and wherein the plurality of valves are configured to provide fluid flow paths between the interior region and external locations to the interior region. The nuclear magnetic resonance (NMR) imaging system is configured to create NMR imaging results of the core sample within the core sample unit. The computed tomography (CT) imaging system is configured to create CT imaging results of the core sample within the core sample unit. The memory is configured to store the imaging results, wherein the imaging results comprise the NMR imaging results, the CT imaging results, and any combination thereof. The monitor may be configured to display the imaging results.

In other configurations of the imaging system, the imaging system may include various enhancements. By way of example, the imaging system may include a control system configured to communicate with the NMR imaging system, the CT imaging system, or any combination thereof and to manage acquiring the NMR imaging result, the CT imaging results, or any combination thereof; wherein the control system may be further configured to manage pressure conditions, temperature conditions, or any combination thereof that the core sample is exposed to during the creation of the NMR imaging results or the creation of the CT imaging results; a heating unit coupled to the core sample unit, wherein the heating unit is further configured to communicate with the control unit and to adjust the temperature within the core sample unit; a temperature sensor coupled to the heating unit, the core sample unit, or any combination thereof, wherein the temperature sensor is further configured to measure temperature data within the core sample unit and to communicate the temperature data with the control unit, the heating unit, or any combination thereof; a pressure unit coupled to the core sample unit, wherein the pressure unit is further configured to communicate with the control unit and to adjust the pressure within the core sample unit; a pressure sensor coupled to the pressure unit, the core sample unit, or any combination thereof, wherein the pressure sensor is further configured to measure pressure data within the core sample unit and to communicate the pressure data with the control unit, the pressure unit, or any combination thereof; a flood fluid unit in fluid communication with the core sample unit, wherein the flood fluid unit is configured to expose the core sample with a flood fluid, and/or wherein the flood fluid unit is configured to communicate with the control unit and to manage fluid flow of the flood fluid into the interior region of the core sample unit.

In yet another configuration, the present techniques may include a system for generating imaging results for a core sample associated with a subsurface region. The system comprises: a processor; an input device in communication with the processor and configured to receive input data associated with a subsurface region; memory in communication with the processor. The memory has a set of instructions, wherein the set of instructions, when executed by the processor, are configured to: isolate a core sample associated with a subsurface region within an imaging system; perform nuclear magnetic resonance (NMR) imaging on the core sample to create NMR imaging results of the core sample; perform computed tomography (CT) imaging on the core sample to create CT imaging results of the core sample; and output imaging results, wherein the imaging results comprise the NMR imaging results, the CT imaging results and any combination thereof.

In other configurations, the system may include various enhancements. By way of example, the system may include wherein the set of instructions, when executed by the processor, that may be further configured to determine producible fluid for the core sample based on the imaging results; wherein the set of instructions, when executed by a processor, may be further configured to determine distribution of oil, water, or any combination thereof based on the imaging results; wherein the set of instructions, when executed by a processor, may be further configured to determine an amount of pores in the core sample, a distribution of pores in the core sample, and/or a content of the pores based on the imaging results; wherein the set of instructions, when executed by a processor, may be further configured to expose a flood fluid to the core sample concurrently with the performing the CT imaging on the core sample and/or NMR imaging; wherein the set of instructions, when executed by a processor, may be further configured to perform a flow simulation based on one of the imaging results; and/or wherein the set of instructions, when executed by a processor, are further configured to perform a notification associated with a hydrocarbon operation based on one of the imaging results, the simulation results, and any combination thereof. Also, the system may include wherein the set of instructions, when executed by a processor, are further configured to: perform a second CT imaging on the core sample; expose a second flood fluid to the core sample concurrently with the performing the second CT imaging on the core sample; and compare imaging results for the flood fluid and the second flood fluid to determine a more efficient hydrocarbon recovery fluid.

Beneficially, the present techniques provide various enhancements to hydrocarbon operations. In some configurations, the present techniques may provide imaging results that include additional data, such as the size, shape, and/or location for the pores. Furthermore, by applying a pressure gradient to the rock media a direct measure of how the media's pore structure affects flow may be obtained. Such flow characterization may be useful in evaluating the flow of hydrocarbons and economic potential of a reservoir rock. Further, the present techniques provide a mechanism that may lessen uncertainty by performing CT imaging, performing NMR imaging, and/or applying an imaging fluid to the core sample. The imaging results may be used to optimize well placement, lessen uncertainty in creating and simulating the subsurface model, and/or enhance appraise the amount and recovery techniques for hydrocarbons in the subsurface region. These benefits provide optimal utilization of resources for improved hydrocarbon operations. The present techniques may be further understood with reference to FIGS. 1 to 11 which are described further below.

FIG. 1 is an exemplary flow chart 100 involving imaging of core samples and using the imaging results in accordance with an embodiment of the present techniques. The flow chart 100 includes a method for performing two or more imaging techniques on a core sample, which may be used to enhance a subsurface model and used to enhance hydrocarbon operations. The imaging techniques may be static (e.g., imaging with no-induced fluid flow) imaging techniques and/or dynamic (e.g., imaging during induced fluid flow) imaging techniques. The method may include obtaining a core sample and data associated with a subsurface region, as shown in blocks 102 to 106. Then, the method includes performing various imaging techniques on the core sample to create imaging results, as shown in blocks 108 to 116. Finally, the imaging results may be used to evaluate the core sample and/or perform simulations and hydrocarbon operations, as shown in blocks 118 and 124.

To begin, the method involves obtaining a core sample and data associated with a subsurface region, as shown in blocks 102 to 106. At block 102, a core sample associated with a subsurface region is obtained. The core sample may be acquired and/or obtained from a wellbore and/or from a storage location. The core sample may be from any portion of the reservoir which is depicted in the subsurface model. Alternatively, the core sample may be from an analogous reservoir whose analysis can be used to enhance the subsurface model of interest. At block 104, porosity and/or permeability data may be obtained. The porosity and/or permeability data may be obtained on a companion rock to the one targeted for the present techniques (e.g., another sample from the same well and/or a sample form another well, which may be in the same the region or area). Such data may provide guidance to the application of the procedures. The porosity and/or permeability data may be calculated, may be accessed from memory and/or may be measured. At block 106, the saturation may be restored to the core sample. The restoration of the saturation, which may optionally be performed, may include infusing the sample with a reference fluid, an example of which is native crude oil.

Once the core sample is obtained, various imaging techniques (e.g., various static imaging techniques) are performed on the core sample to create imaging results, as shown in blocks 108 to 116. At block 108, NMR imaging of the core sample are performed. The NMR imaging may include $^1$H-spectroscopy, $T_2$-relaxometry, PFG NMR diffusometry, 1-D MRI, 2-D MRI, or 3-D MRI of a fluid in the core sample. The NMR imaging results may include quantitative amount of oil and other fluid (e.g., brine) in the core sample, total fluid filled porosity, fractions of smaller and larger fluid filled pores, and/or fluid distribution along the sample and in sample slices. At block 110, CT imaging of the core sample may be performed. The CT imaging may include 2-D imaging and 3-D reconstructions. The CT imaging results may include identification of high-porosity zones, fractures, and detection of specific minerals (e.g. pyrite). At block 112, a determination is made whether the sampling is complete. The determination may involve evaluating the number of images in the imaging results, evaluating the quality of the imaging results, determining whether a specific time has elapsed and/or determining whether a specific number of images have been acquired. If the sampling is not complete, the conditions for the core sample may be adjusted, as shown in block 114. The adjustment to the conditions may include adjusting the pressure that the core sample is exposed to during the imaging, adjusting the temperature that the core sample is exposed to during the imaging, adjusting the fluid (e.g., flood fluid or imaging fluid) that the core sample is exposed to during the imaging, and/or adjusting the core sample. If the sampling is complete, the imaging results may be output, as shown in block 116. The outputting of the imaging results may include storing the imaging results in memory and/or displaying the imaging results.

Once the imaging is completed, the imaging results may be used to evaluate the core sample and/or to perform simulations and for hydrocarbon operations, as shown in blocks 118 and 124. In block 118, the oil and/or water distribution may be determined from the imaging results. The determination of the oil and/or water distribution may include relating this distribution to specific pore characteristics, such as size, for example. At block 120, a subsurface model may be adjusted based on the imaging results. The adjustments to the subsurface model may include, by way of example, adjusting one or more properties in an existing subsurface model and/or creating a subsurface model with properties at least partially based on the imaging results. The creation of the subsurface model may include identifying a subsurface region of interest; defining a subsurface model to represent the subsurface region; and populating or assigning properties, such as flow or mechanical rock properties, to the subsurface model. The subsurface model may be a one-dimensional (1-D), two-dimensional (2-D) or three-dimensional (3-D) model, such as a numerical finite element model, for example; and may include a mesh forming various mesh elements or cells.

As shown in block 122, a simulation may be performed to generate simulation results. To perform the simulation, the imaging results may be augmented with other data to form a reservoir model or a geologic model that may be utilized to perform flow simulations. The augmentation may include the assignment of additional properties to cells associated with one or more objects or other individual sub-volumes. The properties may include transmissibility, rock type, porosity, permeability, rock compressibility, oil saturation, clay content, and/or cementation factors, for example. The performing of the simulation may include modeling fluid flow based on the reservoir model and the associated properties stored within the cells of the reservoir model. The simulation results may include the computation of time-varying fluid pressure and fluid compositions (e.g., oil, water and/or gas saturation) and the prediction of fluid volumes produced or injected at wells. The performing the simulation may include modeling structural changes based on the geologic model and the associated properties stored within the cells of the geologic model. For example, reducing reservoir pressure may reduce porosity which may lead to a sagging overburden. The simulation results and/or the reservoir model may be outputted. The outputting of the simulation results may include displaying the simulation results, which may include generated data as well as the geologic model and/or the reservoir model, on a monitor and/or storing the simulation results in memory of a computer system. The simulation may model fluid flow or geomechanical imaging for different time steps in a set period of time, based on subsurface parameters and/or boundary conditions for each time step, and/or generated data from previous time steps. The subsurface parameters may include mechanical rock properties (e.g., elastic moduli, plasticity parameters), poroelastic parameters, tensile and unconfined compressive strength, contact rules and frictional properties of rock interfaces, number, thickness and distribution of individual rock layers, fault geometry and frictional properties, porosity, pore pressures, thermal coefficients and other suitable parameters.

At block 124, the simulation results and/or the imaging results may be utilized to perform hydrocarbon operations. The hydrocarbon operations may include hydrocarbon exploration operations, hydrocarbon development operations, and/or hydrocarbon production operations. For example, the simulation results and/or the imaging results may be used to estimate or adjust reserves forecasts, reserves estimations and/or well performance prediction. As another example, the imaging results may be used to provide the positive or negative flow performance test results from a well that has been already drilled, or to screen potential subsurface regions for producibility prior to acquiring acreage and committing to a drill well program or to determine which geologic layers are beneficial to perforate or perform enhanced completion practices such as hydraulic fracturing, upon drilling of a production well. As another example, the results may be used to determine if there is sufficient pressure communication between a hydrocarbon reservoir and a water aquifer necessary to provide fluid pressure support for economic production with or without involving additional injection wells. As another example, the connectivity of the pore networks may be used to assess the integrity of high capillary entry pressure seal layers overlying reservoir rocks to determine the likelihood of the presence or absence of quantities of hydrocarbons in the underlying subsurface reservoir that depend on the seal integrity not being destroyed by the presence of connected pore networks. As another example, the simulation results and/or the imaging results may be used to adjust hydrocarbon production operations, such as installing or modifying a well or completion, modifying or adjusting drilling operations, decreasing fracture penetration, and/or to installing or modifying a production facility. The production facility may include one or more units to process and manage the flow of production fluids, such as hydrocarbons and/or water, from the formation.

Beneficially, this method provides an enhancement in the production, development and/or exploration of hydrocarbons. In particular, the present techniques enhances the impact of the geology on subsurface models by linking the flow characteristics to the pore structure. The present techniques integrates the geologic descriptions of pores and textures, which are associated with descriptors, such as facies type, and relates the geologic descriptions with flow characteristics. The resulting geology-guided subsurface description is therefore aligned with the subsurface model, which are highly dependent on flow descriptions.

As may be appreciated, the blocks of FIG. 1 may be omitted, repeated, performed in a different order, or augmented with additional steps not shown. Some blocks may be performed sequentially, while others may be executed simultaneously, concurrently or in parallel. For example, in certain configurations, the NMR imaging and the CT imaging may be performed at different stages (e.g., different conditions, such as different pressures and/or different temperatures) that the core sample is being subjected to during the imaging techniques. Further, in other configurations, a first imaging technique, such as NMR imaging, may be used to constrain the second imaging technique, such as CT imaging. In such configuration, the only one or both of the imaging techniques utilized when the core sample is subjected to the different stages. As another example, an imaging fluid and/or flood fluid may be utilized in blocks 108, 110 or 114 during the imaging of the core sample.

Figure 2:
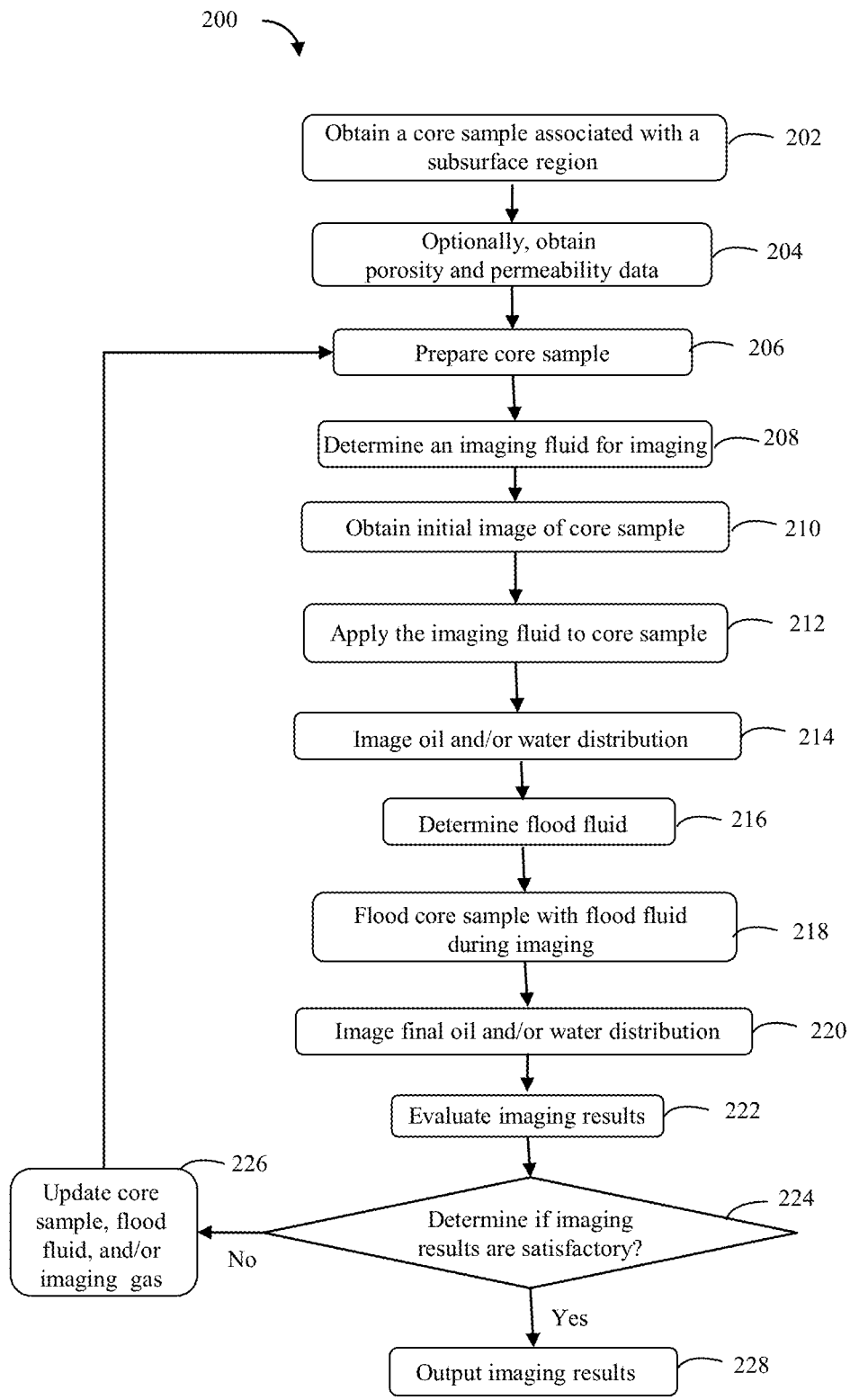
FIG. 2 is an exemplary flow chart involving imaging of core samples with an imaging fluid in accordance with an embodiment of the present techniques.

FIG. 2 is an exemplary flow chart 200 involving dynamic imaging of a core sample with an imaging fluid (e.g., imaging gas, imaging liquid, and/or any combination thereof) in accordance with an embodiment of the present techniques. The flow chart 200 includes a method for performing imaging of a core sample and using a flood fluid and/or imaging fluid during the imaging of the core sample. The method includes obtaining a core sample and data associated with a subsurface region, as shown in blocks 202 to 204, and performing imaging on the core sample with one of flood fluid, imaging fluid, or any combination thereof during the imaging of the core sample, as shown in blocks 206 to 228.

To begin, at block 202, a core sample and data associated with a subsurface region is obtained. Similar to the discussion of block 102 of FIG. 1, the core sample may be obtained or acquired from a well associated with the subsurface region. Then, porosity and/or permeability data may be obtained, as shown in block 204. Similar to block 104 of FIG. 1, the porosity and/or permeability data may be obtained by accessing memory, calculating from the sample or other data, and/or measuring the core sample and/or wellbore.

Then, imaging on the core sample with one of flood fluid, imaging fluid or any combination thereof during the imaging of the core sample may be performed, as shown in blocks 206 to 228. At block 206, the core sample is prepared for imaging. The preparations for imaging may include removing fluid to provide full pore access for the imaging fluid or filling the core sample with a native fluid, such as crude oil. At block 208, an imaging fluid, such as an imaging gas or imaging liquid, may be determined or selected for the imaging. The determination of the imaging fluid, which may preferably be an imaging gas, may include determining the X-ray adsorption coefficient values for the gas pressure range to be utilized and solubilities in one or more fluids in the sample or fluid undetectable for NMR, such as $D_2O$ or fluorohydrocarbons. At block 210, an initial image of the core sample may be obtained. The initial image may optionally be obtained to provide a baseline image using the imaging techniques. At block 212, the imaging fluid may be applied to the core sample. The application of the imaging fluid may include monitoring the infusion into the sample by measuring the X-ray attenuation of the core sample or NMR response from the core sample. At block 214, an image of the oil and/or water distribution may be obtained. The image of the oil and/or water distribution may include 2-D images and/or 3-D images.

At block 216, a flood fluid may be determined or selected. The determination of the flood fluid may include similarity to the native fluid in the reservoir or a test fluid to evaluate enhanced oil recovery performance. The flood fluid may include water, brine, drilling fluids and/or other enhanced oil recovery materials. At block 218, the core sample is flooded with the flood fluid during imaging. The core sample may be flooded with any of several fluids at rates similar to those used in subsurface field operations. The imaging technique may obtain images for various stages of the flooding and/or after flooding is complete to evaluate oil recovery performance. The imaging techniques may include CT imaging and/or NMR imaging.

Once the flooding of the core sample is completed, a final image may be obtained of the oil and/or water distribution, as shown in block 220. The final image may optionally be obtained to provide final state of the core sample using the imaging techniques to be compared with the baseline image or any subsequent images. Then, the imaging results may be evaluated, as shown in block 222. The evaluation of the imaging results may include comparison with mathematical models. Then, at block 224, a determination is made whether the imaging results are satisfactory. The determination may involve determining whether the quality of the imaging results is acceptable in the evaluation, determining whether as specific time has elapsed and/or determining whether a specific number of images have been acquired. If the imaging results are not satisfactory, the core sample, flood fluid and/or imaging fluid may be adjusted, as shown in block 226. The adjustment may include additional volumes of flood fluid or altering the pressure of the imaging fluid. If the imaging results are satisfactory, the imaging results may be output, as shown in block 228. The outputting of the imaging results may include storing the imaging results in memory and/or displaying the imaging results.

Beneficially, the present techniques provides an enhancement in the production, development and/or exploration of hydrocarbons. Again, the present techniques enhance the geology associated with subsurface models by linking the flow characteristics to the pore structure. The geologic descriptions of pores and textures, which are embodied in descriptors, such as facies type, may be related to flow characteristics. The resulting geology-guided subsurface description is therefore aligned with the subsurface models, which may utilize the flow descriptions.

As may be appreciated, the blocks of FIG. 2 may be omitted, repeated, performed in a different order, or augmented with additional steps not shown in FIG. 2. For example, the process may include using CT imaging during the flooding of the core sample, but may also include another imaging technique, such as NMR imaging, to obtain the initial and final imaging results (e.g., images) of the core sample.

Figure 3:
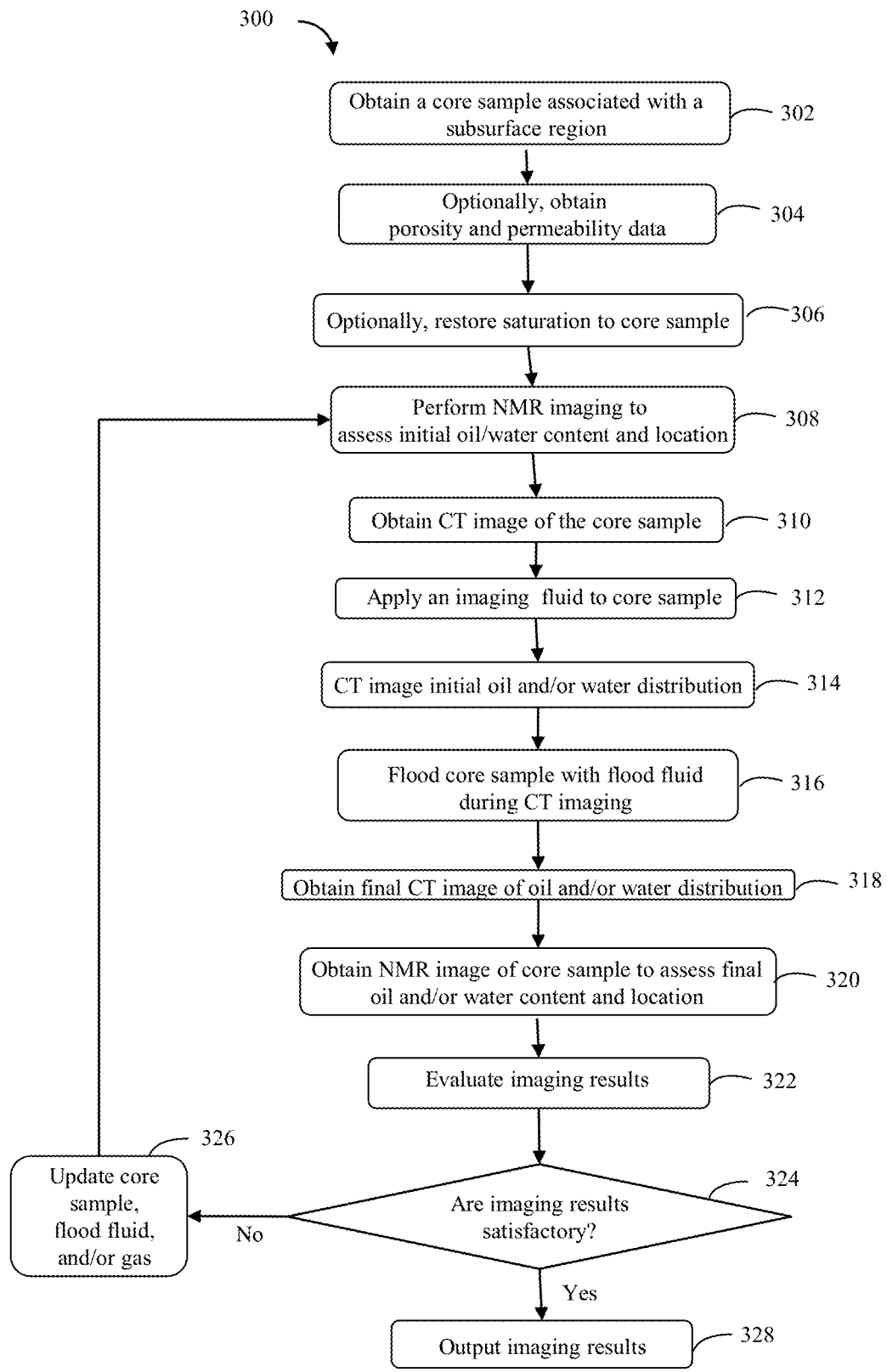
FIG. 3 is an exemplary flow chart involving multiple imaging techniques in accordance with an embodiment of the present techniques.

FIG. 3 is an exemplary flow chart 300 involving multiple dynamic and static imaging techniques in accordance with an embodiment of the present techniques. In this diagram 300, dynamic CT imaging is performed on a core sample with static NMR imaging being performed to provide additional constraints to the processing of the imaging results. In addition, the method may include the use of an imaging fluid and a flood fluid during the CT imaging of the core sample. The method includes obtaining a core sample and data associated with a subsurface region, as shown in blocks 302 to 306, and performing imaging on the core sample, as shown in blocks 308 to 328.

To begin, at block 302, a core sample and data associated with a subsurface region is obtained. Similar to the discussion of block 102 of FIG. 1, the core sample may be obtained or acquired from well associated with the subsurface region. Then, porosity and/or permeability data may be obtained, as shown in block 304. Similar to block 104 of FIG. 1, the porosity and/or permeability data may be obtained by accessing memory, calculating from the core sample or other data, and/or measuring the core sample and/or wellbore. At block 306, the saturation of the core sample may be restored. Similar to the discussion of block 106 of FIG. 1, the core sample may be restored to saturation levels.

Then, the method involves performing imaging on the core sample, as shown in blocks 308 to 328. At block 308, the NMR imaging is performed to assess initial oil and/or water distribution (e.g., content and location) within the core sample. The NMR imaging, which is a static imaging technique, may include $^1$H-spectroscopy, $T_2$-relaxometry, PFG NMR diffusometry, 1-D MRI, 2-D MRI or 3-D MRI of fluid in the core sample. The NMR imaging results may include quantitative amount of oil and brine in the core sample, total fluid filled porosity, fractions of smaller and larger fluid filled pores, fluid distribution along the core sample and in sample slices. At block 310, an initial CT image may be obtained for the core sample. The CT image is obtained to provide a baseline CT image for the core sample. At block 312, an imaging fluid, such as an imaging gas, is applied to the core sample. The application of the imaging fluid may include monitoring the infusion into the core sample by measuring the X-ray attenuation of the core sample. At block 314, a CT image of the oil and/or water distribution may be obtained. The CT image of the oil and/or water distribution may include 2-D images and 3-D images.

At block 316, the core sample is flooded with the flood fluid during the CT imaging. The core sample may be flooded with any of several fluids at rates, which are similar to the rates used in hydrocarbon operations (e.g., subsurface field operations). The CT imaging may obtain images for various stages of the flooding, or after flooding is complete to evaluate oil recovery performance. Once the flooding of the core sample is completed, a final CT image may be obtained of the oil and/or water distribution, as shown in block 318. The final image may optionally be obtained to provide final state of the core sample using the CT imaging technique to be compared with the baseline or initial CT image or any subsequent CT images. At block 320, the NMR imaging is performed to assess initial oil and/or water distribution, such as the oil and/or water content and location. The NMR imaging may include $^1$H-spectroscopy, $T_2$-relaxometry, PFG NMR diffusometry, 1-D MRI, 2-D MRI or 3-D MRI of fluids in the core sample. The NMR imaging results may include quantitative amount of oil and other fluids (e.g., brine) in the core sample, total fluid filled porosity, fractions of smaller and larger fluid filled pores, fluid distribution along the sample and in sample slices.

Then, the imaging results may be evaluated, as shown in block 322. The evaluation of the imaging results may include comparison with mathematical models. Then, at block 324, a determination is made whether the imaging results are satisfactory. The determination may involve determining whether the quality of the imaging results are acceptable in the evaluation, determining whether a specific time has elapsed and/or determining whether a specific number of images have been acquired. If the imaging results are not satisfactory, the core sample, flood fluid and/or imaging gas may be adjusted, as shown in block 326. The adjustment may include additional volumes of flood fluid and/or altering the pressure of the imaging fluid. If the imaging results are satisfactory, the imaging results may be output, as shown in block 328. The outputting of the imaging results may include storing the imaging results in memory and/or displaying the imaging results.

As may be appreciated, the blocks of FIG. 3 may be omitted, repeated, performed in a different order, or augmented with additional steps not shown in FIG. 3. By way of examples, the operating conditions for performing the steps in FIG. 3 may be similar to downhole conditions, which may involve similar temperatures and/or pressures along with similar flow conditions (e.g., laminar flow). In particular, the downhole conditions may involve pressures in the range between 10 pounds per square inch (psi) and 4000 psi, in the range between 10 psi and 2000 psi or in the range between 10 psi and 1000 psi. Also, the downhole conditions may involve temperatures in the range between 60° Fahrenheit (F.) and 800° F., in the range between 60° F. and 600° F. or in the range between 60° F. and 500° F. As yet another example, the operating conditions may involve laboratory conditions, which may involve temperatures, pressures and/or flow regimes that are different from downhole conditions. Specifically, laboratory conditions may include pressures in the range between 10 psi and 500 psi, in the range between 10 psi and 250 psi or in the range between 10 psi and 100 psi. Also, the laboratory conditions may involve temperatures in the range between 40° F. and 600° F., in the range between 40° F. and 500° F. or in the range between 60° F. and 400° F.

Figure 4:
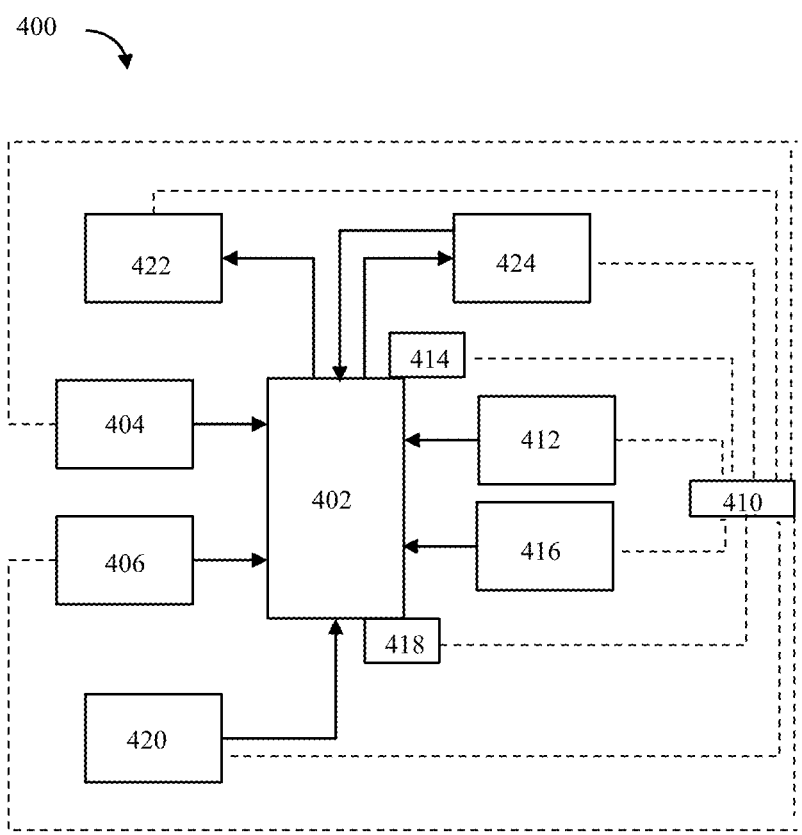
FIG. 4 is an exemplary diagram of a core sample imaging system in accordance with an embodiment of the present techniques.

FIG. 4 is an exemplary diagram of a core sample imaging system 400 in accordance with an embodiment of the present techniques. In the core sample imaging system 400, a core sample (not shown) may be disposed into an interior region within a core sample unit 402. The core sample unit 402 may have a housing that forms an interior region, which is isolated from external conditions outside of the housing and various valves that provide fluid flow paths into and out of the interior region. The core sample imaging system 400 may be configured to enclose the core sample into an isolated and controlled environment, to provide specific pressure and temperature conditions on a core sample and to monitor these conditions. Further, the core sample imaging system 400 may be configured to provide and to manage an imaging fluid and/or flood fluid to interact with the core sample. Also, the core sample imaging system 400 may be configured to perform various imaging techniques on the core sample to obtain imaging results, such as dynamic images and/or static images.

To manage the pressure and temperature conditions that the core sample is exposed to during the imaging, the core sample imaging system 400 may include a control system 410 that may be utilized with and communicate with a heating unit 412, a pressure unit 416, a temperature sensor 414 and a pressure sensor 418. The heating unit 412 may be configured to increase, decrease or maintain the temperature within the core sample unit 402. The heating unit 412 may include a furnace, an electric heater, a boiler, a heat exchanger and/or any combination thereof. The temperature sensor 414 may be configured to measure temperature data associated with the internal region of the core sample unit 402, to store the measured temperature data, and/or to communicate the temperature data or a notification associated with the temperature data to the control unit 410. The temperature sensor 414 may include a single temperature sensor or two or more temperature sensors distributed around the core sample unit 402. The temperature sensor 414 may include a thermistor, thermocouple, resistance thermometer or other suitable temperature measurement device. Similarly, the pressure unit 416 may be configured to increase, decrease, or maintain the pressure within the core sample unit 402. The pressure unit 416 may include a compressor, a blower, an expander and/or any combination thereof. The pressure sensor 418 may be configured to measure pressure as pressure data associated with the internal region of the core sample unit 402, to store the measured pressure data and/or to communicate the pressure data or a notification associated with the pressure data to the control unit 410. The pressure sensor 418 may include a single pressure sensor or two or more pressure sensors distributed around the core sample unit 402. The pressure sensor 418 may include a piezoresistive strain gauge, capacitive gauge, piezoelectric gauge, electromagnetic gauge, an optical gauge or other suitable pressure measurement device.

In addition, to perform various imaging techniques on the core sample, the core sample imaging system 400 may include a first imaging system 404 and a second imaging system 406. Each of the imaging systems 404 and 406 may be configured to obtain images of the core sample (e.g., static or dynamic images), which may each include a different imaging technology. For example, the first imaging system 404 may be an NMR imaging system that is configured to obtain NMR imaging data (e.g., static imaging data), while the second imaging system 406 may be a CT imaging system that is configured to obtain CT imaging data (e.g., dynamic imaging data). The control unit 410 may be used with the first imaging system 404 and the second imaging system 406 to manage the acquisition of the imaging results.

Further, to provide and manage imaging fluid and/or flood fluid interaction with the core sample, the core sample imaging system 400 may include flood fluid units 420 and 422 and imaging fluid unit 424. For example, the flood fluid units 420 and 422 may be in fluid communication with the core sample unit 402 via different valves (not shown). The first flood fluid unit 420 may include different vessels, conduits, and valves are coupled together to provide a flood fluid having a specific composition at a specific flow rate. For example, each of the vessels may contain different fluids that may be mixed together to provide a flood fluid having a specific composition to interact with the core sample. The flood fluid may be provided within a specific pressure range, temperature range and/or flow rate range. The different compositions of flood fluid may be used to test different recovery techniques on the core sample for use in recovering hydrocarbons. The second flood fluid unit 422 may include a separating unit (e.g., a centrifuge and/or phase separator), different vessels, conduits and valves are coupled together to separate the flood fluid within the core sample unit 402 into different components. The different components may then be provided to the first flood fluid unit 420 via various conduits (not shown). The imaging fluid unit 424 may include different vessels, conduits and valves are coupled together to provide an imaging fluid having a specific composition. The imaging fluid may be provided within a specific pressure range, temperature range, and/or flow rate range. For example, each of the vessels may contain a different imaging fluids that may be used for different configurations to interact with the core sample. The different imaging fluids may each have a different compositions and may be used to test different recovery techniques on the core sample. The imaging fluid unit 424 may include a separating unit (e.g., a centrifuge and/or phase separator) to separate the imaging fluid into different components and associated vessels. The control unit 410 may be used with the flood fluid units 420 and 422 and imaging fluid unit 424 to manage the pressure, temperature and flow rate of the respective fluids.

Figure 5:
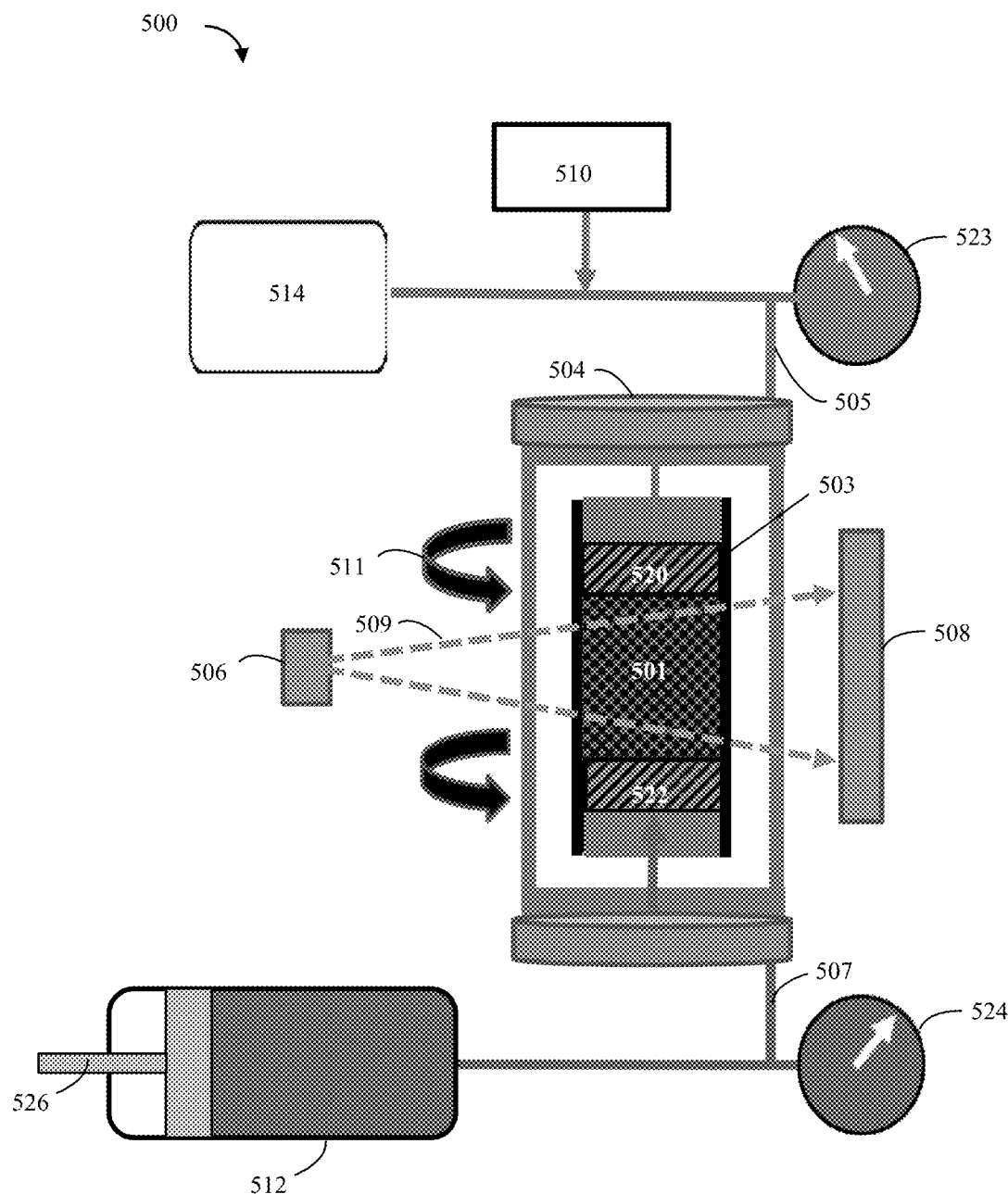
FIG. 5 is an exemplary diagram of a CT imaging system.

One configuration of an imaging system may include a CT imaging system. For example, FIG. 5 is an exemplary diagram 500 of the CT imaging system. The CT imaging system may include pressurized core holder 502, spiral coil housing 504, an X-ray source 506, and detector 508. A core sample 501, which may be a cylindrical rock sample, is placed in a pressurized core holder 502, with a jacket 503 surrounding the core sample 501 to isolate the rock pore space from the surrounding pressure fluid 520 and 522. At the upper and lower ends of the core sample 501, tubing, such as imaging fluid tubing 505 and flood fluid tubing 507, provides access for imaging fluid from the imaging fluid tank 510 and flood fluid from a flood fluid tank 512, respectively. For example, the imaging fluid tubing 505 may provide a flow path between the core sample and the imaging fluid tank 510 along with the produced fluid tank 514. The imaging fluid tubing 505 may include one or more conduits and valves that is utilized to manage fluid flow. In addition, the imaging fluid tubing 505 may include an imaging sensor 523 the monitors the flow rate, pressure, or temperature of fluids in the imaging fluid tubing 505. As another example, the flood fluid tubing 507 may provide a flow path between the core sample and the flood fluid tank 512. The flood fluid stored in the flood fluid tank 512 and may be passed to the core sample by using a hydraulic actuator 526 (e.g., motor, valve and piston configuration). In addition, the flood fluid tubing 507 may include a flood sensor 524 that monitors the flow rate, pressure, or temperature of fluids in the flood fluid tubing 507.

To obtain CT imaging results for the core sample 501, the CT imaging system 500 may utilize the X-ray source 506 and detector 508 that are located on opposite sides of the core sample 501. Processing data for transmission of the X-ray beam through the sample in a stationary setting, as shown by arrows 509, provides a mechanism for 2-D images to be generated of the core sample. To produce 3-D images, imaging data may be acquired at many angles and sample rotation is facilitated by spiral coil housings 504, which may rotate as shown by arrows 511. The spiral coil housing 504 may involve dynamic tension of the tubing, which supplies fluids to the core sample 501 disposed in the interior region of the spiral coil housing 504. To minimize the total time to rotate the core sample 501 and facilitate collection of imaging data, which may be analyzed for time-dependent effects, 3-D data collection angles are distributed around the rotation axis, which may involve using a Sorted-Golden-Ratio algorithm. The Sorted-Golden-Ratio algorithm is a modification of the Golden-Ratio scan technique, which is known to those skilled in the art. In addition, interspersed within those angles, imaging data taken at a single Key-Angle, the set of which may be analyzed to indicate 2-D changes with times shorter than 3-D data collection. In certain configuration, the core samples may be cylindrical rock samples that are 1 inch to 1.5 inches in outside diameter and from 1 inch to 2 inches in length, but the core sample may be utilized for any size sample.

Figure 6:
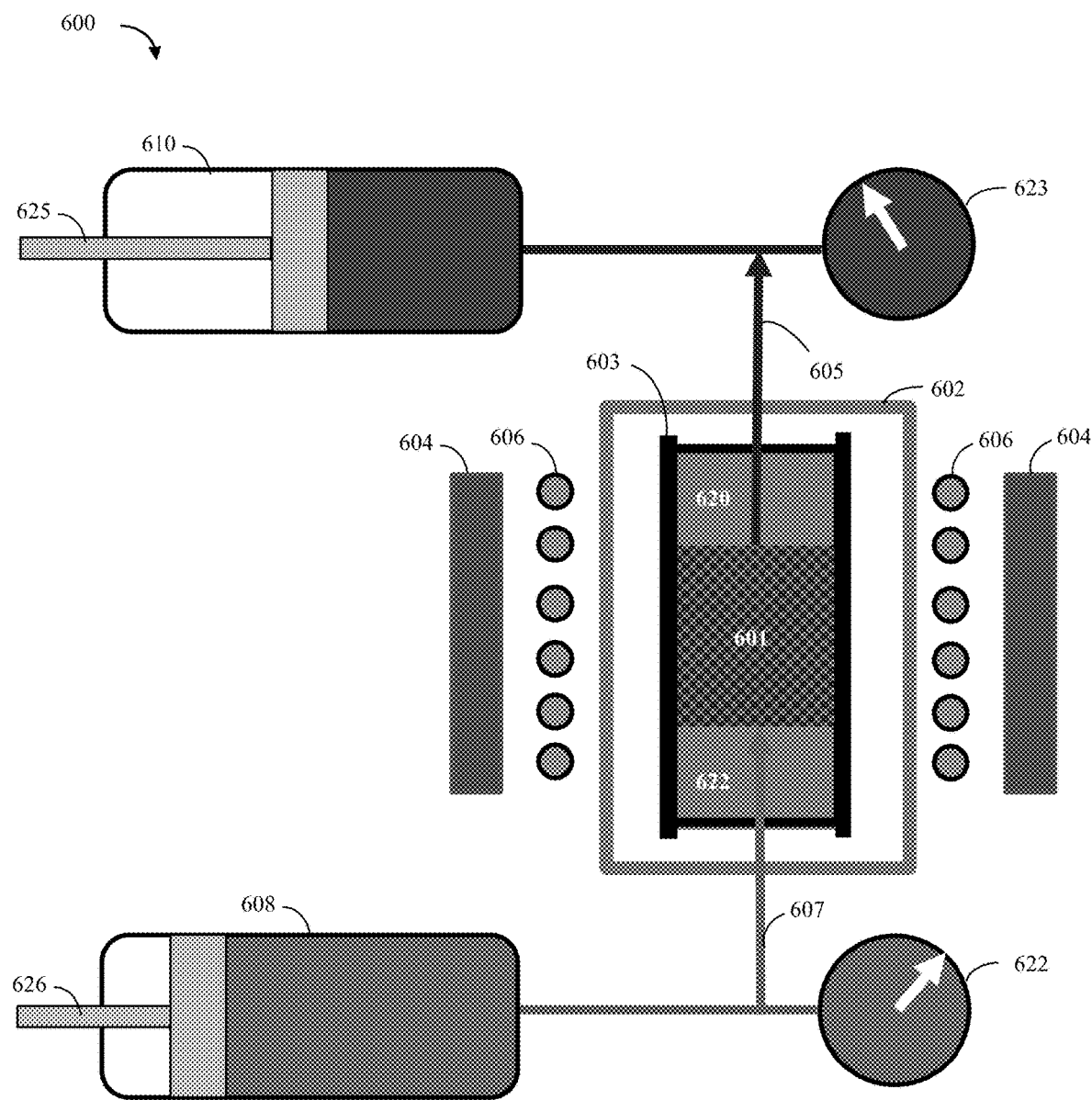
FIG. 6 is an exemplary diagram of a NMR imaging system.
Figure 7A:
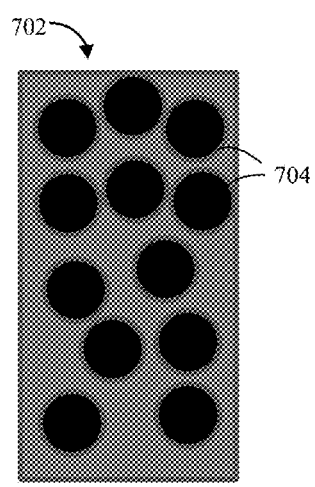
FIGS. 7A to 7D are exemplary diagrams showing examples of CT imaging data analysis.
Figure 7B:
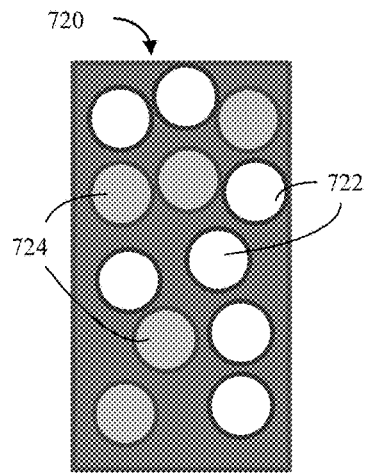
Figure 7C:
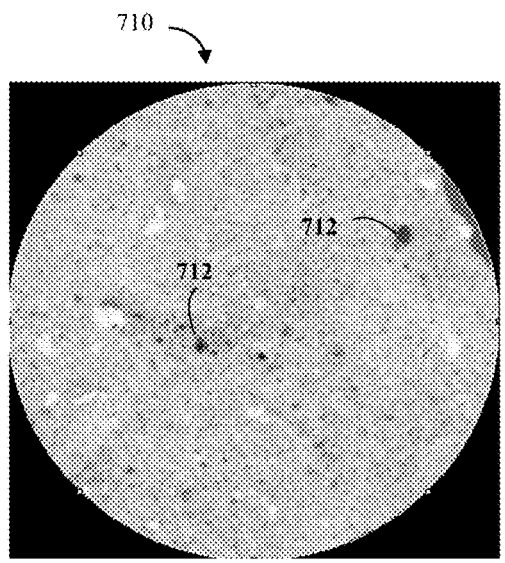
Figure 7D:
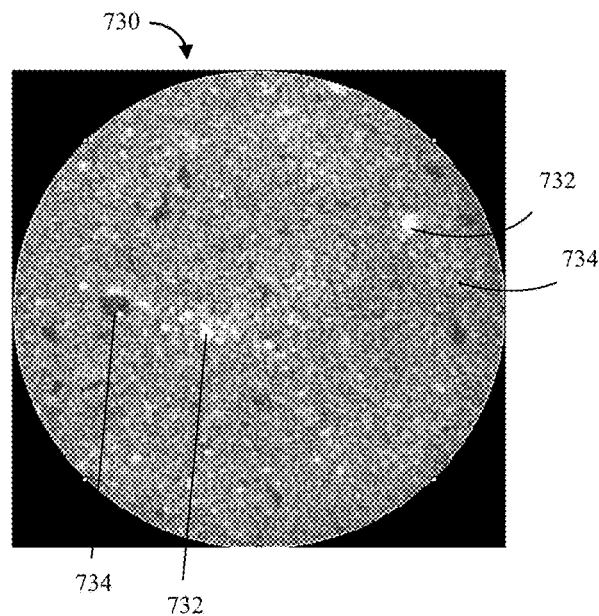

Another example configuration of an imaging system is shown in FIG. 6. FIG. 6 is an exemplary diagram 600 of the NMR imaging system. The NMR imaging system may include a pressurized core holder 602, an NMR source 604, an NMR detector 606, produced fluid tank 610, and flood fluid tank 608. In this NMR imaging system, a core sample 601, such as a cylindrical rock sample, may be placed in a pressurized core holder 602 with a jacket 603 surrounding the core sample 601 to isolate the rock pore space from the surrounding pressure fluid 620 and 622. The core sample may be cylindrical rock samples that are 1 inch to 1.5 inches in outside diameter and from 1 inch to 2 inches long, or may have a diameter less than 4 inches. At the upper and lower ends of the core sample 601, tubing, such as imaging fluid tubing 605 and flood fluid tubing 607, provides access for flooding fluid from the flood fluid tank 608 and a produced fluid from the produced fluid tank 610, respectively. For example, the produced fluid tubing 605 may provide a flow path between the core sample and the produced fluid tank 610. The produced fluid tubing 605 may include one or more conduits and valves that is utilized to manage fluid flow. By way of example, the produced fluid may be stored in the produced fluid tank 610 and may be conducted away from the core sample 601 by using a hydraulic actuator 625 (e.g., motor, valve and piston configuration). In addition, the produced fluid tubing 605 may include a produced sensor 623 that monitors the flow rate, pressure, or temperature of fluids in the produced fluid tubing 605. As another example, the flood fluid tubing 607 may provide a flow path between the core sample 601 and the flood fluid tank 608. The flood fluid may be stored in the flood fluid tank 608 and may be passed to the core sample 601 by using a hydraulic actuator 626 (e.g., motor, valve and piston configuration). In addition, the flood fluid tubing 607 may include a flood sensor 624 the monitors the flow rate, pressure, or temperature of fluids in the flood fluid tubing 607.

To obtain NMR imaging results for the core sample 601, the NMR imaging system 600 may utilize the NMR source 604 and an NMR detector 606. By way of example, the core sample 601 may be disposed within the pressurized core holder 602, which may be mounted in the cylindrical bore of the NMR source 604 (e.g., magnet) and the NMR detector 606 (e.g., a detector coil) surrounding the NMR source 604. During imaging mode, a magnetic field may be generated that interacts with the core sample 601. It is not to those skilled in the art that various detector-coil radio-frequency voltage pulses induces a sample response that provides details of the fluid component. With a high-field magnet, the resulting data from the generated signals may be used to discriminate between oil and water through proton spectroscopy. The resulting NMR imaging results may be used in fluid specific analysis, such as water versus oil content, relaxometery showing pore contents of water and oil, and mapping of oil and water concentration within the core sample. Further, combined with a flooding fluid, the fluid specific analysis may provide data to determine characteristics of oil recovery that are pore structure specific.

FIGS. 7A to 7D are exemplary diagrams of CT imaging data analysis. The diagrams 702, 710, 720 and 730 may be utilized in detecting oil and/or water filled pores in core sample with or without an imaging gas. In the diagrams 702 and 710 shown in FIGS. 7A and 7C, no imaging gas is present in the core samples. In the diagram 710, a cross-section of an exemplary core sample having a cylindrical shape is shown. In diagram 702, a horizontal slice from a 3-D reconstruction of an exemplary core sample is shown. In each of these diagram 702 and 710, no imaging gas is present and the pores, such as pores 704 and 712 are darker than the other portions of the core sample, respectively. In the diagrams 720 and 730 shown in FIGS. 7B and 7C, the effect of high solubility of the imaging gas in the oil filled pores of the core samples. In the diagram 730, a cross-section of an exemplary core sample having a cylindrical shape is shown. In diagram 720, a horizontal slice from a 3-D reconstruction of an exemplary core sample is shown. In these diagrams 720 and 730, the imaging gas highlights the oil locations, which are indicated as lighter areas, such as areas 722 and 732. The lighter areas are oil filled pores, while the grey or darker areas, such as areas 724 and 734, are pores not filled with oil, which may be water filled pores. As a result, the darker areas are not highlighted by the imaging gas. Quantitative analysis may provide a complete description of the pore-size and distribution of both oil-filled and water-filled pores.

FIGS. 8A to 8D are exemplary diagrams of CT imaging data analysis. The diagrams 802, 810, 820 and 830 may be utilized in oil and/or brine spatial distribution during flood fluid, which may be a brine fluid. In FIG. 8A the diagram 802, an oil-filled cylindrical sample 804 is shown, where imaging gas has been applied to highlight the oil-filled pores. In FIG. 8C, the diagram 820 image is a 3-D reconstruction from the oil-filled cylindrical sample 804 having very uniform, small-pore structure. In this diagram 820, the NMR results have been relied upon to guide segmentation and to produce a direct image of the oil distribution throughout the reconstructed model sample 822. In FIG. 8B, in diagram 810, the effect of applying a flood fluid flow from the bottom portion 814 of the cylindrical sample 812 is shown, which has the oil produced from the top portion 816 resulting in a gradient of concentration. In FIG. 8D, in diagram 830, a 3-D reconstruction of oil-distribution in the cylindrical sample 812 after 3.3 pore volumes (PV) of flood fluid have been provided to interact with the cylindrical sample 812. As shown in diagram 830, the oil component in the reconstructed model sample 832 is shown as the lighter shading. Thus, water component occupies the lower part of the reconstructed model sample 832.

Figure 9A:
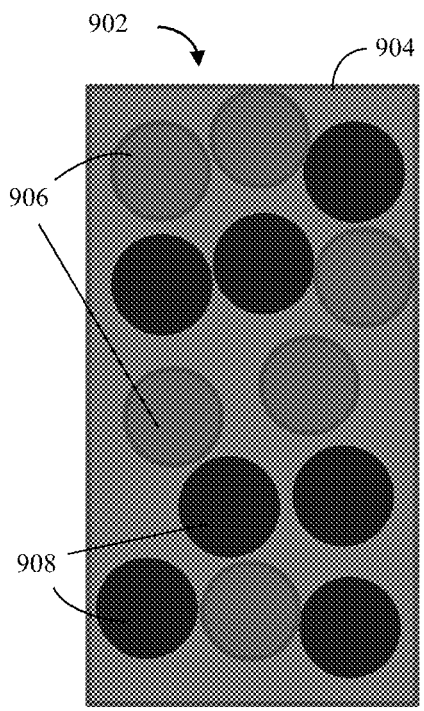
FIGS. 9A to 9D are exemplary diagrams showing examples of NMR imaging data analysis.
Figure 9B:
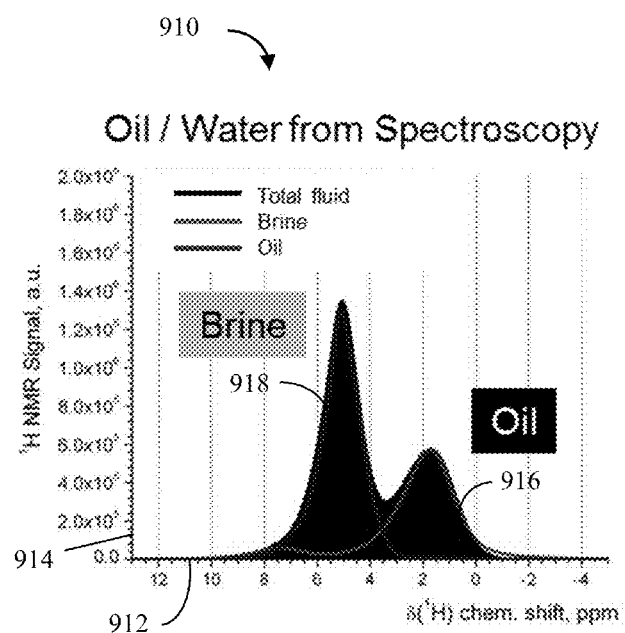
Figure 9C:
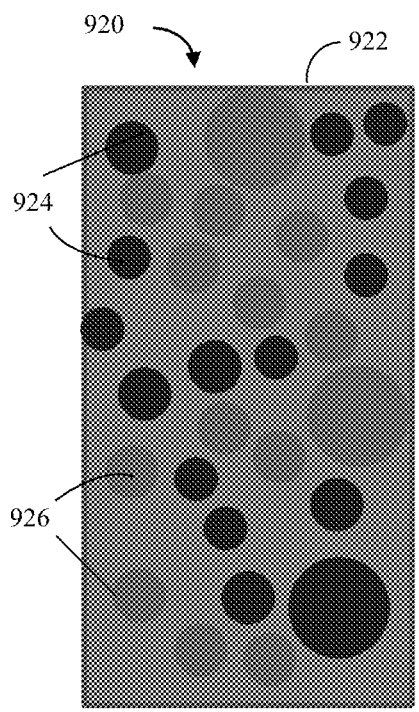
Figure 9D:
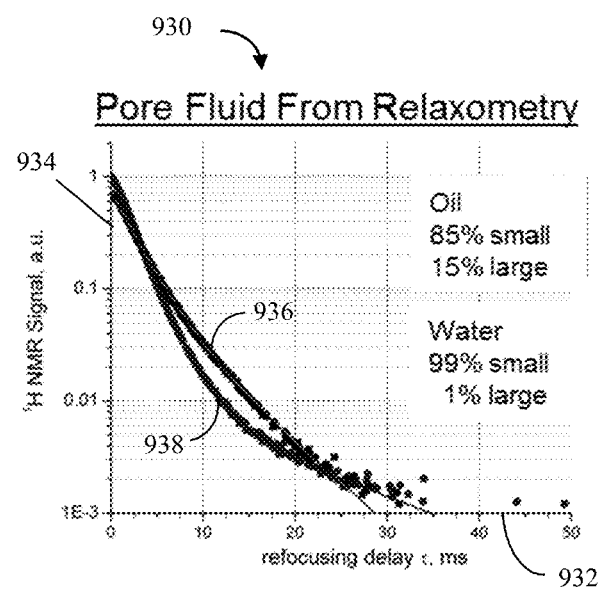

FIGS. 9A to 9D are exemplary diagrams of NMR imaging data analysis. In FIGS. 9A and 9B, in the diagrams 902 and 910, proton spectroscopy may be utilized to measure the oil and water content of the core sample. In FIG. 9A, in diagram 902 is a cross-section of an exemplary core sample 904, which includes oil-filled pores 906 and water-filled pores 908, for example. In FIG. 9B, in diagram 910 is a chart of oil and water from spectroscopy. In diagram 910, the spectrum for the oil response 916 and brine response 918 are shown along an $^1$H NMR Signal axis 914 in atomic units (a.u) and a δ ($^1$H) chemical (chem.) shift axis 912 in parts per million (ppm), along with fitted lines which are used to calculate the content of each fluid in the core sample 904. Also, the sum of the two responses equals the total fluid-filled porosity. In FIGS. 9C and 9D, in the diagrams 920 and 930, the pores size is compared with the relaxometry. The fluid-specific relaxometry indicates the fluid and type for two classes of pore types, which may be large and small. In FIG. 9C, diagram 920 is a cross-section of an exemplary core sample 922, which includes oil-filled pores 924 and water-filled pores 926, for example. In FIG. 9D, in diagram 930 is a chart of pore fluid from relaxometry. In diagram 930, the oil response 936 and water response 938 are shown along a $^1$H NMR signal axis 934 in atomic units (a.u) and a refocusing delay τ axis 932 in milliseconds (ms). The data, plotted on the right, are fitted with an equation that allows the calculation of the percent of each pore-size component. Data depicted in these figures, when combined, provide a comprehensive measure of the sample oil and water content and the distribution of fluid by pore type.

Figure 10A:
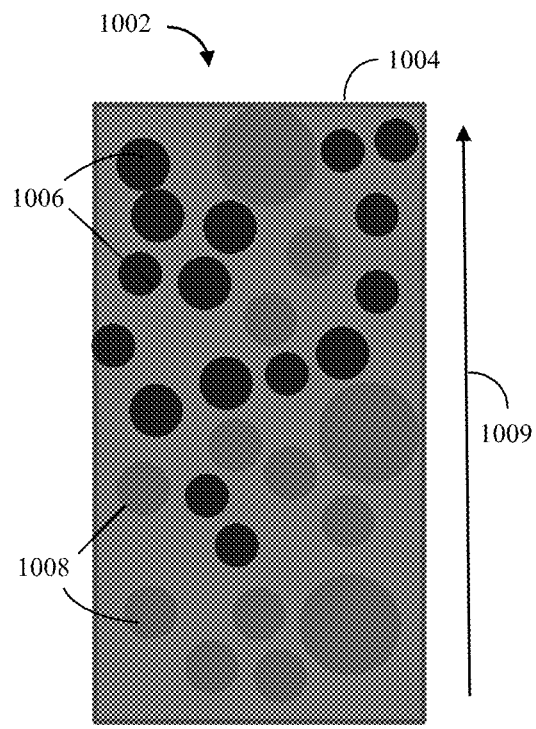
FIGS. 10A to 10C are exemplary diagrams showing examples of NMR imaging data analysis.
Figure 10B:
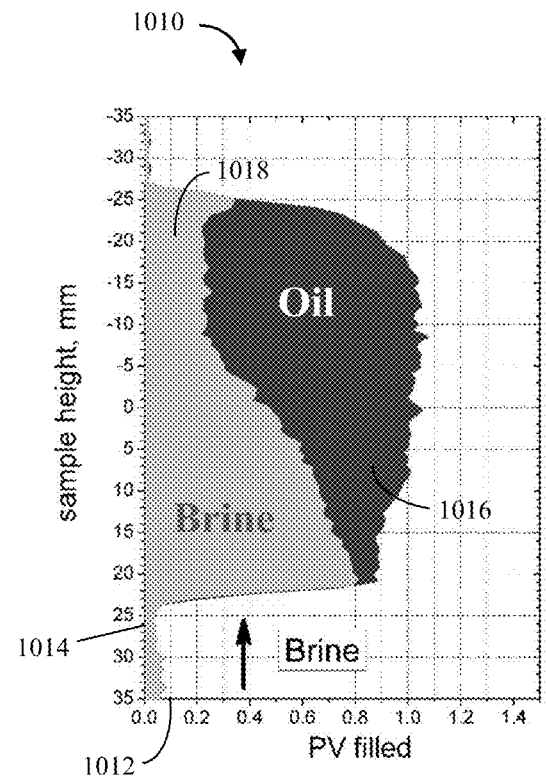
Figure 10C:
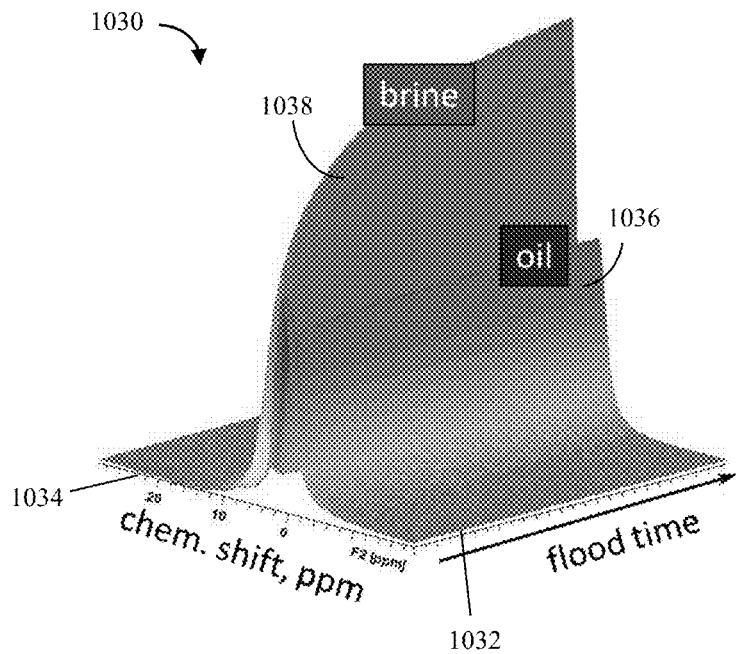

FIGS. 10A to 10C are exemplary diagrams of NMR imaging data analysis. In diagram 1002 in FIG. 10A, diagram 1010 in FIG. 10B, and diagram 1030 in FIG. 10C, oil and/or brine spatial distribution during brine flood is shown, which represents the water and oil content in a core sample 1004 after a partial flood from bottom to top, as shown by arrow 1009. Diagram 1002 is a cross-section of an exemplary core sample 1004, which includes oil-filled pores 1006 and water-filled pores 1008, for example. Diagram 1010 is a chart of NMR measured 1-D concentration profiles of oil and brine along the core sample 1004. In diagram 1010, the oil response 1016, and brine response 1018 are shown along a sample height axis 1014 in millimeters (mm) and pore volume percent (PV %) filled axis 1012 in milliliters. In diagram 1010, the details of the profile depend on pore structure, and the evolution with increasing flood fluid measures oil recovery efficiency. Such data are generated by analysis of the NMR data. In diagram 1030, the evolution of oil and brine saturation during a brine flood is shown. Diagram 1030 is the measured oil and brine content of the core sample 1004 at different times of the brine flood. In diagram 1030, the oil response 1036, and brine response 1038 are shown along a chemical (chem.) shift axis 1034 in parts per million (ppm) and flood time axis 1032 in seconds. In this diagram 1030, oil is slowly extracted during the brine flood, which may indicate that another flood fluid may provide additional enhancements in the oil recovery.

The present techniques involves a method and system that provides a mechanism to enhance subsurface modeling and simulation of a subsurface region. This modeling and simulating may be useful in determining the presence, distribution, characteristics and flow properties in the subsurface by using multiple imaging techniques, one or more imaging techniques with an imaging fluid (e.g., imaging gas, imaging liquid and/or any combination thereof), and/or one or more imaging techniques with a flood fluid (e.g., flood gas, flood liquid and/or any combination thereof).

In certain configurations, the present techniques may include steps to enhance the hydrocarbon operations. For example, the present techniques may include creating and/or updating a subsurface model; applying or assigning properties to the subsurface model for use in a simulation, which are based on the imaging results; comparing the simulation results with measured data; and if the comparison provides an acceptable match (e.g., below a specific threshold) and the subsurface model is considered to be consistent with the geologic interpretation, while if the comparison does not provide an acceptable match, the subsurface model may be updated and the simulation is repeated with the updated properties and/or other elements. Further, the subsurface model may be a one-dimensional (1-D) model, two-dimensional (2-D) model or three-dimensional (3-D) model.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present invention is in no way limited to implementation in any specific operating system or environment.

Figure 11:
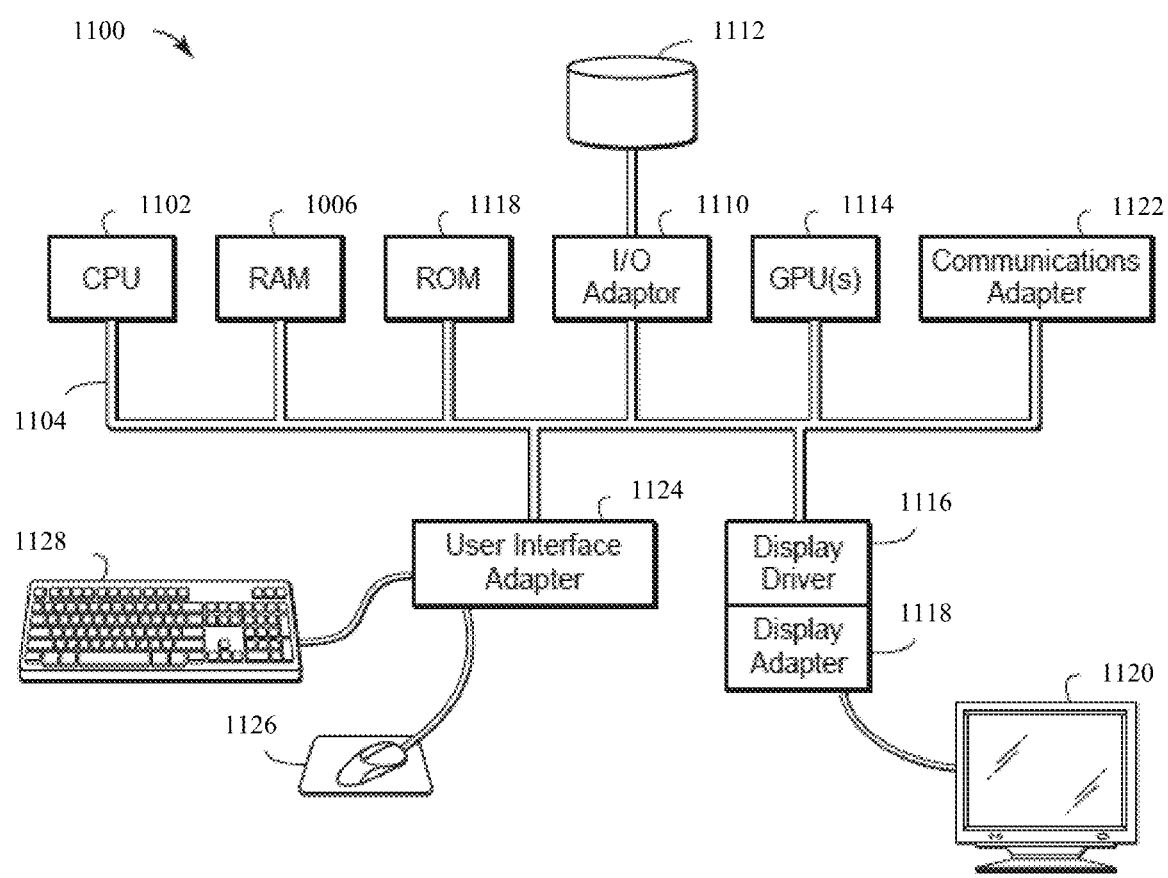
FIG. 11 is a block diagram of a computer system that may be used to perform any of the methods disclosed herein.

As an example, FIG. 11 is a block diagram of a computer system 1100 that may be used to perform any of the methods disclosed herein. A central processing unit (CPU) 1102 is coupled to system bus 1104. The CPU 1102 may be any general-purpose CPU, although other types of architectures of CPU 1102 (or other components of exemplary system 1100) may be used as long as CPU 1102 (and other components of system 1100) supports the present techniques as described herein. The CPU 1102 may execute the various logical instructions according to disclosed aspects and methodologies. For example, the CPU 1102 may execute machine-level instructions for performing processing according to aspects and methodologies disclosed herein.

The computer system 1100 may also include computer components such as a random access memory (RAM) 1106, which may be SRAM, DRAM, SDRAM, or the like. The computer system 1100 may also include read-only memory (ROM) 1108, which may be PROM, EPROM, EEPROM, or the like. RAM 1106 and ROM 1108 hold user and system data and programs, as is known in the art. The computer system 1100 may also include an input/output (I/O) adapter 1110, a communications adapter 1122, a user interface adapter 1124, and a display adapter 1118. The I/O adapter 1110, the user interface adapter 1124, and/or communications adapter 1122 may, in certain aspects and techniques, enable a user to interact with computer system 1100 to input information.

The I/O adapter 1110 preferably connects a storage jdevice(s) 1112, such as one or more of hard drive, compact disc (CD) drive, floppy disk drive, tape drive, etc. to computer system 1100. The storage device(s) may be used when RAM 1106 is insufficient for the memory requirements associated with storing data for operations of embodiments of the present techniques. The data storage of the computer system 1100 may be used for storing information and/or other data used or generated as disclosed herein. The communications adapter 1122 may couple the computer system 1100 to a network (not shown), which may enable information to be input to and/or output from system 1100 via the network (for example, a wide-area network, a local-area network, a wireless network, any combination of the foregoing). User interface adapter 1124 couples user input devices, such as a keyboard 1128, a pointing device 1126, and the like, to computer system 1100. The display adapter 1118 is driven by the CPU 1102 to control, through a display driver 1116, the display on a display device 1120, which may also be coupled to a graphical processing unit (GPU) 1114.

The architecture of system 1100 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

As may be appreciated, the method may be implemented in machine-readable logic, such that a set of instructions or code that, when executed by a processor, performs the instructions or operations from memory. By way of example, a system for generating a subsurface model having one or more objects associated with a subsurface region is described. The system comprises: a processor; an input device in communication with the processor and configured to receive input data associated with a subsurface region; and memory in communication with the processor. The memory having a set of instructions, wherein the set of instructions, when executed by the processor, are configured to:

In yet another configuration, the present techniques may include a system for generating imaging results for a core sample associated with a subsurface region. The system comprises: a processor; an input device in communication with the processor and configured to receive input data associated with a subsurface region; memory in communication with the processor. The memory has a set of instructions, wherein the set of instructions, when executed by the processor, are configured to: isolate a core sample associated with a subsurface region within an imaging system; perform nuclear magnetic resonance (NMR) imaging on the core sample to create NMR imaging results of the core sample; perform computed tomography (CT) imaging on the core sample to create CT imaging results of the core sample; and output imaging results, wherein the imaging results comprise the NMR imaging results, the CT imaging results and any combination thereof.

In other configurations, the set of instructions may include various enhancements. By way of example, the set of instructions, when executed by the processor, may be further configured to determine producible fluid for the core sample based on the imaging results; may be further configured to determine distribution of oil, water or any combination thereof based on the imaging results; may be further configured to determine an amount of pores in the core sample, a distribution of pores in the core sample, content of the pores based on the imaging results; may be further configured to expose a flood fluid to the core sample concurrently with the performing the CT imaging on the core sample or NMR imaging; may be further configured to perform a flow simulation based on one of the imaging results; and/or may be further configured to perform a notification associated with a hydrocarbon operation based on one of the imaging results, the simulation results and any combination thereof. Also, the set of instructions, when executed by a processor, may be further configured to: perform a second CT imaging on the core sample; expose a second flood fluid to the core sample concurrently with the performing the second CT imaging on the core sample; and compare imaging results for the flood fluid and the second flood fluid to determine a more efficient hydrocarbon recovery fluid.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. As such, it will be apparent, however, to one skilled in the art, that many modifications and variations to the embodiments described herein are possible. All such modifications and variations are intended to be within the scope of the present invention, as defined by the appended claims.

The invention claimed is:

1. A method for generating and using imaging results of a core sample for hydrocarbon operations comprising:
   obtaining a core sample associated with a subsurface region;
   performing nuclear magnetic resonance (NMR) imaging on the core sample to create NMR imaging results of the core sample;
   performing computed tomography (CT) imaging on the core sample to create CT imaging results of the core sample wherein the NMR imaging results are used to constrain the selection of X-ray attenuation coefficients used to produce the CT imaging; and outputting imaging results, wherein the imaging results comprise the NMR imaging results, the CT imaging results, and any combination thereof.

2. The method of claim 1, further comprising determining producible fluid for the core sample based on the imaging results.

3. The method of claim 1, further comprising determining distribution of oil, water, or any combination thereof based on the imaging results.

4. The method of claim 1, further comprising determining one or more of an amount of pores in the core sample, a distribution of pores in the core sample, and a content of the pores based on the imaging results.

5. The method of claim 1, further comprising exposing a flood fluid to the core sample concurrently with the performing of the CT imaging on the core sample or NMR imaging.

6. The method of claim 5, wherein the flood fluid comprises water or hydrocarbon recovery fluid.

7. The method of claim 5, wherein after performing the CT imaging or NMR imaging on the core sample, the method further comprising:

performing a second CT imaging on the core sample, wherein the core sample is exposed to a second flood fluid concurrently with the performing of the second CT imaging on the core sample; and comparing imaging results for the imaging taken during the flood fluid and the second flood fluid to determine a more efficient hydrocarbon recovery fluid.

8. The method of claim 5, wherein the flood fluid is doped with a doping agent that has a selectivity for hydrocarbons over water greater than 5.

9. The method of claim 1, further comprising drilling a well to obtain a core sample from the subsurface region.

10. The method of claim 1, further comprising performing a flow simulation based on one of the imaging results.

11. The method of claim 10, further comprising performing a hydrocarbon operation based on one of the imaging results, the simulation results, and any combination thereof.

12. An imaging system, comprising:

a core sample unit comprising a housing and a plurality of valves, wherein the housing forms an interior region configured to hold a core sample and to isolate the interior region from external conditions, and wherein the plurality of valves are configured to provide fluid flow paths between the interior region and external locations to the interior region;

a nuclear magnetic resonance (NMR) imaging system configured to create NMR imaging results of the core sample within the core sample unit;

a computed tomography (CT) imaging system configured to create CT imaging results of the core sample within the core sample unit, wherein the NMR imaging results are used to constrain the selectin of X-ray attenuation coefficients used to produce the CT imaging results;

memory configured to store the imaging results, wherein the imaging results comprise the NMR imaging results; the CT imaging results and any combination thereof; and a monitor configured to display the imaging results.

13. The imaging system of claim 12, further comprising a control system configured to communicate with the NMR imaging system, the CT imaging system, or any combination thereof, wherein the control system is configured to manage acquiring the NMR imaging result, the CT imaging results, or any combination thereof.

14. The imaging system of claim 12, wherein a control system is further configured to manage pressure conditions that the core sample is exposed to during the creation of the NMR imaging results or the creation of the CT imaging results, temperature conditions that the core sample is exposed to during the creation of the NMR imaging results or the creation of the CT imaging results, or any combination thereof.

15. The imaging system of claim 14, further comprising:

a heating unit coupled to the core sample unit, wherein the heating unit is configured to communicate with the control unit and to adjust the temperature within the core sample unit; and a temperature sensor coupled to the heating unit, the core sample unit, or any combination thereof, wherein the temperature sensor is configured to measure temperature data within the core sample unit and to communicate the temperature data with the control unit, the heating unit, or any combination thereof.

16. The imaging system of claim 14, further comprising:

a pressure unit coupled to the core sample unit, wherein the pressure unit is configured to communicate with the control unit and to adjust the pressure within the core sample unit; and a pressure sensor coupled to the pressure unit, the core sample unit, or any combination thereof, wherein the pressure sensor is configured to measure pressure data within the core sample unit and to communicate the pressure data with the control unit, the pressure unit, or any combination thereof.

17. The imaging system of claim 12, further comprising a flood fluid unit in fluid communication with the core sample unit, wherein the flood fluid unit is configured to expose the core sample with a flood fluid.

18. The imaging system of claim 17, wherein the flood fluid unit is configured to communicate with the control unit and to manage fluid flow of the flood fluid into the interior region of the core sample unit.

* * * * *